US006797750B2

(12) United States Patent
Taniguchi et al.

(10) Patent No.: US 6,797,750 B2
(45) Date of Patent: Sep. 28, 2004

(54) FLAME-RETARDANT EPOXY RESIN COMPOSITION, MOLDED ARTICLE THEREOF, AND ELECTRONIC PART

(75) Inventors: Masatoshi Taniguchi, Osaka (JP); Yuji Tada, Tokushima (JP); Yoichi Nishioka, Tokushima (JP)

(73) Assignee: Otsuka Kagaku Kabushiki Kaisha (JP)

( * ) Notice: Subject to any disclaimer, the term of this patent is extended or adjusted under 35 U.S.C. 154(b) by 0 days.

(21) Appl. No.: 10/221,813

(22) PCT Filed: Mar. 19, 2001

(86) PCT No.: PCT/JP01/02154

§ 371 (c)(1), (2), (4) Date: Nov. 7, 2002

(87) PCT Pub. No.: WO01/70844

PCT Pub. Date: Sep. 27, 2001

(65) Prior Publication Data

US 2003/0114606 A1 Jun. 19, 2003

(30) Foreign Application Priority Data

Mar. 21, 2000 (JP) ....................................... 2000-078987
Oct. 30, 2000 (JP) ....................................... 2000-331189

(51) Int. Cl.[7] ............................ C08K 5/49; C08L 63/02

(52) U.S. Cl. ........................ 523/451; 523/466; 525/529; 528/51; 528/116; 528/407; 528/408; 528/418

(58) Field of Search ................................ 523/451, 466; 525/529; 528/51, 116, 407, 408, 418

(56) References Cited

FOREIGN PATENT DOCUMENTS

| | | |
|---|---|---|
| JP | 04279625 | 10/1992 |
| JP | 0625389 | 2/1994 |
| JP | 06247989 | 9/1994 |
| JP | 8193091 | 7/1996 |
| JP | 10259292 | 9/1998 |
| JP | 10298188 | 11/1998 |
| JP | 2000309685 | 11/2000 |

*Primary Examiner*—Philip Tucker
*Assistant Examiner*—D. Aylward
(74) *Attorney, Agent, or Firm*—Wood, Phillips, Katz, Clark & Mortimer

(57) ABSTRACT

The present invention has an object to provide a flame-retardant epoxy resin composition excellent in heat resistance and moisture resistance. A flame-retardant epoxy resin composition relating to the present invention contains an epoxy resin (A), a phosphazene compound (B), an epoxy hardener (C) and an inorganic filler (D), wherein the phosphazene compound (B) and the epoxy hardener (C) are included in the range of 0.01 to 70% by weight and in the range of 0 to 70% by weight, respectively, relative to a total quantity of the epoxy resin (A), the phosphazene compound (B) and the epoxy hardener (C), and the inorganic filler (D) is included in the range of 0 to 95% by weight relative to a total quantity of the epoxy resin (A), the phosphazene compound (B), the epoxy hardener (C) and the inorganic filler (D), wherein the phosphazene compound (B) is at least one selected from the group consisting of (1) a cyclic and/or a chain phosphazene compound with a specific structure, (2) a polymer of the cyclic and/or the chain phosphazene compound; and (3) a reaction product of the cyclic and/or the chain phosphazene compound with one type of a compound selected from the group consisting of an epoxy compound, a phenol compound, an amine compound and an acid anhydride.

9 Claims, No Drawings

FLAME-RETARDANT EPOXY RESIN COMPOSITION, MOLDED ARTICLE THEREOF, AND ELECTRONIC PART

TECHNICAL FIELD

The present invention relates to a flame-retardant epoxy resin composition, a molded article thereof and an electronic part.

BACKGROUND ART

Epoxy resin has been widely used as insulating materials of electrical and electronic parts such as a laminate material and an encapsulating material for a semiconductor device, for example, IC, LSI, VLSI or the like because of excellencies in electrical characteristics such as insulating property, heat resistance, moisture resistance, acid resistance, solvent resistance, adhesiveness, mechanical properties, dimensional stability and others, and furthermore, relative inexpensiveness.

In company with great development in the electronic technology in recent years, a progress toward high integration in a semiconductor device and a laminate has reached to higher level and at the same time, requirements for higher reliability thereof have been increased. In such a current situation, epoxy resin used as an insulating material has also been required to have better characteristics thereof such as heat resistance (including soldering heat resistance), a flame retardance, moisture resistance, adhesiveness and mechanical properties.

In order to improve characteristics, especially flame retardance and heat resistance, of epoxy resin, a phosphazene compound is compounded into the resin as a flame retardant and/or a hardener (for example, Japanese Unexamined Patent Publication No. Sho-61-120850, Japanese Unexamined Patent Publication No. Sho-48-37500, Japanese Examined Patent Publication No. Hei-3-4565, Japanese Examined Patent Publication No. Hei-6-104714 and Japanese Unexamined Patent Publication No. Hei-10-259292).

Phosphazene compounds disclosed in the prior arts all lack a sufficient effect in an aspect of improving moisture resistance of epoxy resin. Moisture resistance of epoxy resin is an especially important property in a case where the resin is used as material of a printed circuit board. That is, since laminates have a chance to be used in the air with a high frequency and an insulating property and, hence, a reliability are degraded due to moisture absorption, the resin is desired to have a low water absorption and no change in electrical characteristics such as an insulating property. In a case where a phosphazene compound low in effect of improving moisture resistance is used as a laminate material, inconveniences such as swelling or peeling of a metal sheet, a metal foil or the like occurs due to moisture absorption in a high temperature treatment such as a soldering process, thereby disabling a laminate with a long term reliability to be obtained.

DISCLOSURE OF THE INVENTION

The present inventors have conducted serious studies in order to solve the above problem, which, as a result of the studies, leads to a discovery that epoxy resin compounded with a specific phosphazene compound can exert conspicuously excellent performance, thereby having completed the present invention.

That is, according to the present invention, there is provided a flame-retardant epoxy resin composition containing an epoxy resin (A) and a phosphazene compound (B), wherein the component (B) is included in the range of 0.01 to 70% by weight relative to a total quantity of the component (A) and the component(B), and wherein the component (B) is at least one member selected from the group consisting of (1) a cyclic and/or a chain phosphazene compound expressed by a general formula (1):

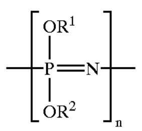

wherein each $R^1$ and $R^2$, being identical or different, is an alkyl group having 1 to 18 carbon atoms, a cycloalkyl group having 5 to 8 carbon atoms, an aryl group having 6 to 14 carbon atoms, an alkylaryl group having 7 to 18 carbon atoms, an alkenyl group having 2 to 18 carbon atoms, an alkenylaryl group having 8 to 18 carbon atoms, an amino group-substituted phenyl group, an aminoalkyl group-substituted phenyl group where the aminoalkyl group has 1 to 6 carbon atoms, a hydroxy group-substituted phenyl group, a hydroxyalkyl group-substituted phenyl group where the hydroxyalkyl group has 1 to 6 carbon atoms, a glycidyloxy group-substituted phenyl group or a glycidyloxyalkyl group-substituted phenyl group where the glycidyloxyalkyl group has 4 to 9 carbon atoms, providing that at least one of n $R^1$s and n $R^2$s is the amino group-substituted phenyl group, the aminoalkyl group-substituted phenyl group where the aminoalkyl group has 1 to 6 carbon atoms, the hydroxyalkyl group-substituted phenyl group where the hydroxyalkyl group has 1 to 6 carbon atoms, the glycidyloxy group-substituted phenyl group or the glycidyloxyalkyl group-substituted phenyl group where the glycidyloxyalkyl group has 4 to 9 carbon atoms, and n indicates an integer of from 3 to 10000;

(2) a polymer of the cyclic and/or the chain phosphazene compound; and (3) a reaction product of the cyclic and/or the chain phosphazene compound with at least one compound selected from the group consisting of an epoxy compound, a phenol compound, an amine compound and an acid anhydride.

The flame-retardant epoxy resin composition is further compounded with an epoxy hardener (C), wherein the component (B) and the component (C) are included in the range of 0.01 to 70% by weight and in the range of 0 to 70% by weight, respectively, relative to a total quantity of the component (A), the component(B) and the component (C).

Furthermore, according to the present invention, there is provided a flame-retardant epoxy resin composition containing an epoxy resin (A), a phosphazene compound (B), an epoxy hardener (C) and an inorganic filler (D), wherein the component (B) and the component (C) are included in the range of 0.01 to 70% by weight and in the range of 0 to 70% by weight, respectively, relative to a total quantity of the component (A), the component(B) and the component (C), and the component (D) is included in the range of 0 to 95% by weight relative to a total quantity of the component (A), the component(B), the component (C) and the component (D) and wherein the component (B) is at least one member selected from the group consisting of (1) a cyclic and a chain phosphazene compound expressed by a general formula (1):

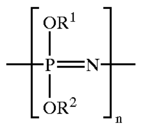

wherein each $R^1$ and $R^2$, being identical or different, is an alkyl group having 1 to 18 carbon atoms, a cycloalkyl group having 5 to 8 carbon atoms, an aryl group having 6 to 14 carbon atoms, an alkylaryl group having 7 to 18 carbon atoms, an alkenyl group having 2 to 18 carbon atoms, an alkenylaryl group having 8 to 18 carbon atoms, an amino group-substituted phenyl group, an aminoalkyl group-substituted phenyl group where the aminoalkyl group has 1 to 6 carbon atoms, a hydroxy group-substituted phenyl group, a hydroxyalkyl group-substituted phenyl group where the hydroxyalkyl group has 1 to 6 carbon atoms, a glycidyloxy group-substituted phenyl group or a glycidyloxyalkyl group-substituted phenyl group where the glycidyloxyalkyl group has 4 to 9 carbon atoms, providing that at least one of n $R^1$s and n $R^2$s is the amino group-substituted phenyl group, the aminoalkyl group-substituted phenyl group where the aminoalkyl group has 1 to 6 carbon atoms, the hydroxyalkyl group-substituted phenyl group where the hydroxyalkyl group has 1 to 6 carbon atoms, the glycidyloxy group-substituted phenyl group or the glycidyloxyalkyl group-substituted phenyl group where the glycidyloxyalkyl group has 4 to 9 carbon atoms, and n indicates an integer of from 3 to 10000;

(2) a polymer of the cyclic and/or the chain phosphazene compound; and (3) a reaction product of the cyclic and/or the chain phosphazene compound with at least compound selected from the group consisting of an epoxy compound, a phenol compound, an amine compound and an acid anhydride.

A phosphazene compound of the component (B) used in the present invention is good in reactivity and compatibility with an epoxy resin and considered to act as a hardener and a flame retardant for the epoxy resin. This compound does not degrade electrical characteristics such as an insulating property, mechanical properties, adhesiveness and others of the epoxy resin, rather exerts excellent performance to improve the characteristics and properties according to a case and, in addition, further increase moisture resistance. A high reliability is therefore shown and also sustained over a long time by a molded article (a molded product) obtained by molding a flame-retardant epoxy resin composition of the present invention, for example an electronic part such as a laminate.

BEST MODE FOR CARRYING OUT THE INVENTION

Description will be given for components used in the present invention below. Note that the term of a "polymer" used in this specification includes an oligomer.

Component (A): Epoxy Resins

As epoxy resins, there can be exemplified the following epoxy resins commonly used in the electrical and electronic fields: for example, novolak epoxy resin obtained by a reaction between phenols and aldehydes, such as phenol novolak epoxy resin, brominated phenol novolak epoxy resin, orthocresol novolak epoxy resin or naphthol novolak epoxy resin; phenol epoxy resin obtained by a reaction between a phenol and epichlorohydrin, such as bisphenol-A epoxy resin, brominated bisphenol-A epoxy resin, bisphenol-F epoxy resin, bisphenol-AD epoxy resin, bisphenol-S epoxy resin, biphenol epoxy resin, alkyl-substituted biphenol epoxy resin or tris(hydroxyphenyl) methane; aliphatic epoxy resin obtained by a reaction between an alcohol and epichlorohydrin, such as trimethylol propane, oligopropylene glycol or hydrogenated bisphenol-A; glycidyl ester epoxy resin obtained by a reaction between hexahydrophthalic acid, tetrahydrophthalic acid or phthalic acid and epichlorohydrin or 2-methyl epichlorohydrin; glycidyl amine epoxy resin obtained by a reaction between an amine such as diaminodiphenyl methane or amino phenol and epichlorohydrin; heterocyclic epoxy resin obtained by a reaction between a polyamine such as isocyanuric acid and epichlorohydrin; and modified compounds of the above epoxy resins. Among them, preferable are phenol novolak epoxy resin, orthocresol novolak epoxy resin, bisphenol-A epoxy resin, biphenol epoxy resin, phenol epoxy resin obtained by a reaction between tris(hydroxyphenyl) methane and epichlorohydrin and others. The epoxy resins can be used singly or in a combination of two or more thereof.

Component (B): Phosphazene Compounds

A phosphazene compound used as a component (B) of the present invention is at least one member selected from the group consisting of (1) a cyclic and/or a chain phosphazene compound expressed by a general formula (1):

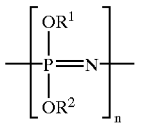

wherein each $R^1$ and $R^2$, being identical or different, is an alkyl group having 1 to 18 carbon atoms, a cycloalkyl group having 5 to 8 carbon atoms, an aryl group having 6 to 14 carbon atoms, an alkylaryl group having 7 to 18 carbon atoms, an alkenyl group having 2 to 18 carbon atoms, an alkenylaryl group having 8 to 18 carbon atoms, an amino group-substituted phenyl group, an aminoalkyl group-substituted phenyl group where the aminoalkyl group has 1 to 6 carbon atoms, a hydroxy group-substituted phenyl group, a hydroxyalkyl group-substituted phenyl group where the hydroxyalkyl group has 1 to 6 carbon atoms, a glycidyloxy group-substituted phenyl group or a glycidyloxyalkyl group-substituted phenyl group where the glycidyloxyalkyl group has 4 to 9 carbon atoms, providing that at least one of n $R^1$s and n $R^2$s is additionally the amino group-substituted phenyl group, the aminoalkyl group-substituted phenyl group where the aminoalkyl group has 1 to 6 carbon atoms, the hydroxyalkyl group-substituted phenyl group where the hydroxyalkyl group has 1 to 6 carbon atoms, the glycidyloxy group-substituted phenyl group or the glycidyloxyalkyl group-substituted phenyl group where the glycidyloxyalkyl group has 4 to 9 carbon atoms, and n indicates an integer of from 3 to 10000;

(2) a phosphazene polymer obtained by polymerization of the cyclic and/or the chain phosphazene compound; and (3) a reaction product of the cyclic and/or the chain phosphazene compound with at least one compound selected from the group consisting of an epoxy compound, a phenol compound, an amine compound and an acid anhydride.

The phosphazene compounds can be used singly or in a combination of two or more thereof.

The amino group-substituted phenyl group selectable as a substituent indicated by $R^1$ and $R^2$ is a group obtained by substituting 1 to 5 amino and/or aminoalkyl groups at any carbon atom or atoms on a benzene ring. This applies to the aminoalkyl group-substituted phenyl group where the aminoalkyl group has 1 to 6 carbon atoms, the hydroxy group-substituted phenyl group, the hydroxyalkyl group-substituted phenyl group where the hydroxyalkyl group has 1 to 6 carbon atoms, the glycidyloxy group-substituted phenyl group and the glycidyloxyalkyl group-substituted phenyl group where the glycidyloxyalkyl group has 4 to 9 carbon atoms in a similar manner.

Note that an alkali metal salt described hereinafter means a potassium salt, a sodium salt, a lithium salt or the like.

[Amino Phosphazene Compound (1a)]

An amino phosphazene compound (1a) that is a phosphazene compound (1) in which at least one of n $R^1$s and n $R^2$s is additionally an amino group-substituted phenyl group and/or an aminoalkyl group-substituted phenyl group is obtained according to a known prior method, for example, in which an alkali metal salt of nitrophenol and/or nitroalkyl phenol and phosphonitrile chloride are reacted with each other to produce nitrophenoxy phosphazene or nitroalkylphenoxy phosphazene and then, hydrazine or hydrazine hydrate is used to reduce a nitro group thereof to an amino group in the presence of a catalyst with a halide of a metal selected from the group consisting of chromium, manganese, iron, cobalt, nickel, zinc and tin, or a sulfate carried on active charcoal. Furthermore, there can be adopted a catalytic hydrogenation method using a Raney nickel catalyst described in Inorganic Chemistry, 6(2), 394, 1967 and a known lithium aluminum hydride reduction method or a known boron hydride reduction method.

Furthermore, in the reaction of an alkali metal salt of nitrophenol and/or nitroalkyl phenol and phosphonitrile chloride with each other, there can be included, as a reactant, at least one selected from the group consisting of alcohol compounds expressed by $R^3OM$ (in the formula, $R^3$ indicates an alkyl group having 1 to 18 carbon atoms, a cycloalkyl group having 5 to 8 carbon atoms, an alkylaryl group having 7 to 18 carbon atoms or an alkenyl group having 2 to 18 carbon atoms; and M indicates lithium, sodium or potassium) and phenol compounds expressed by $R^4OM$ (in the formula, $R^4$ indicates an aryl group having 6 to 14 carbon atoms or an alkenylaryl group having 8 to 18 carbon atoms and M indicates lithium, sodium or potassium). Thereby, there are obtained aminophosphazene compounds (1a) each having plural amino and/or aminoalkyl group-substituted phenol groups as substitutes.

As nitrophenols and nitroalkyl phenols, there are named, for example, 3-nitrophenol, 4-nitrophenol, 4-nitromethyl phenol, 4-nitroethyl phenol, 4-nitrobutyl phenol and others.

As alcohol compounds and phenol compounds, there are named, for example, alkali metal salts of methanol, ethanol, n-propanol, allylalcohol, isopropanol, n-butanol, n-octanol, 2,2,2-trifluoroethanol, 2,2,3,3,4,4,5,5-octafluoropentyl alcohol, phenol, 4-methyl phenol, 4-ethyl phenol, 1-naphtol, 2-natphthol, 4-allyl phenol, 4-chlorophenol, 4-trifluoromethyl phenol and others and sodium phenolate or sodium 4-methyl phenolate is preferable in terms of heat resistance.

As concrete examples of aminophosphazene compounds (1a), there can be named, for example, cyclotriphosphazenes with an aminophenoxy group and a phenoxy group as substitutes in a mixed manner such as aminophenoxypentaphenoxycyclotriphosphazene, di(aminophenoxy)-tetraphenoxycyclotriphosphazene, tri (aminophenoxy)-triphenoxycyclotriphosphazene, tetra (aminophenoxy)-diphenoxycyclotriphosphazene, penta (aminophenoxy)-phenoxycyclotriphosphazene, and hexaaminophenoxycyclotriphosphazene; cyclotriphosphazenes with an aminomethylphenoxy group and a phenoxy group as substitutes in a mixed manner such as aminomethylphenoxy-pentaphenoxycyclotriphosphazene, di(aminomethylphenoxy)-tetraphenoxycyclotriphosphazene, tri (aminomethylphenoxy)-triphenoxycyclotriphosphazene, tetra(aminomethylphenoxy)-diphenoxycyclotriphosphazene, penta (aminomethylphenoxy)-phenoxycyclotriphosphazene, and hexaaminomethylphenoxy cyclotriphosphazene; cyclotriphosphazenes with an aminoethylphenoxy group and a phenoxy group as substitutes in a mixed manner such as aminoethylphenoxy-pentaphenoxycyclotriphosphazene, di(aminoethylphenoxy)-tetraphenoxycyclotriphosphazene, tri(aminoethylphenoxy)-triphenoxycyclotriphosphazene, tetra(aminoethylphenoxy)-diphenoxycyclotriphosphazene, penta(aminoethylphenoxy)-phenoxycyclotriphosphazene, and hexaaminoethylphenoxy cyclotriphosphazene; cyclotriphosphazenes with an aminobutylphenoxy group and a phenoxy group as substitutes in a mixed manner such as aminobutylphenoxy-pentaphenoxycyclotriphosphazene, di(aminobutylphenoxy)-tetraphenoxycyclotriphosphazene, tri(aminobutylphenoxy)-triphenoxycyclotriphosphazene, tetra(aminobutylphenoxy)-diphenoxycyclotriphosphazene, penta(aminobutylphenoxy)-phenoxycyclotriphosphazene, and hexaaminobutylphenoxy-cyclotriphosphazene; and others.

Furthermore, there are named cyclotriphosphazenes with an aminoethylphenoxy group, and an octyloxy group, trifluoroethoxy group, an octafluoropentyloxy group, an ethylphenoxy group, a naphthyloxy group, an allyloxy group, a chlorophenoxy group or a trifluoromethylphenoxy group as substitutes in a mixed manner.

Furthermore, there are named cyclotetraphosphazene, cyclopentaphosphazene, cyclohexaphosphazene, a cyclophosphazene mixture (a mixture of cyclophosphazenes of the general formula (1) with n being 3 to 15), a linear phosphazene mixture (a mixture of linear phosphazenes of the general formula (1) with n being 3000 on average) and a cyclic (=cyclo) and linear phosphazene mixture (a mixture of cyclic and linear phosphazenes of the general formula (1) with n=1000 on average) each with an aminophenoxy group and a phenoxy group as substitutes in a mixed manner.

Furthermore, there are named cyclotetraphosphazene, cyclopentaphosphazene, cyclohexaphosphazene, a cyclophosphazene mixture (a mixture of cyclophosphazenes of the general formula (1) with n being 3 to 15), a linear phosphazene mixture (a mixture of linear phosphazenes of the general formula (1) with n=3000 on average) and a cyclic (=cyclo) and linear phosphazene mixture (a mixture of cyclic and linear phosphazenes of the general formula (1) with n=1000 on average) each with an aminoethylphenoxy group and a phenoxy group as substitutes in a mixed manner. The aminophosphazene compounds may include mixtures of compounds with two or more types of substituents.

Among the above aminophosphazenes (1a), preferable are, for example, hexaaminophenoxycyclotriphosphazene; hexaaminoethylphenoxycyclotriphosphazene; a cyclotriphosphazene with an aminophenoxy group and a phenoxy group as substitutes in a mixed manner; a cyclotriphosphazene with an aminoethylphenoxy group and a phenoxy group as substitutes in a mixed manner; a cyclophosphazene mixture (a mixture of cyclophosphazenes of the general formula (1) with n being 3 to 15) with an aminophenoxy group and a phenoxy group as substitutes in a mixed manner; a linear phosphazene mixture (a mixture of linear phosphazenes of the general formula (1) with n=3000 on average) with an aminoethylphenoxy group and a phenoxy group as substitutes in a mixed manner and especially preferable are a cyclophosphazene mixture (a mixture of cyclophosphazenes of the general formula (1) with n being 3 to 15) with an aminophenoxy group and a phenoxy group as substitutes in a mixed manner and a linear phosphazene mixture (a mixture of linear phosphazenes of the general formula (1) with n=3000 on average) with an aminoethylphenoxy group and a phenoxy group as substitutes in a mixed manner.

[Hydroxy Phosphazene Compound (1b)]

A hydroxy phosphazene compound (1b) that is a phosphazene compound (1) in which at least one of n $R^1$s and n $R^2$s is additionally a hydroxy group-substituted phenyl group and/or a hydroxyalkyl group-substituted phenyl group can be obtained according to known methods described in articles and a patent publication; for example, Masaaki YOKOYAMA, et.al.,; Journal of the Chemical Society of Japan. Industrial chemistry, Vol. 67, No. 9, p. 1378 (1964), Tomoya OKUBASHI, et.al.,; Journal of the Chemical Society of Japan. Industrial chemistry, Vol. 73, No. 6, p. 1164 (1970), Japanese Unexamined Patent Publication No. Sho-58-219190, Alessandro Medici, et. al., Macromolecules, Vol. 25, No. 10, p. 2569 (1992) and others. That is, an alkali metal salt of 4-methoxyphenol or 4-(benzyloxy)phenol in which one hydroxyl group of bivalent phenol is protected by a methyl group or benzyl group and phosphonitrile chloride (Japanese Unexamined Patent Publication No. Sho-54-145394, Japanese Unexamined Patent Publication No. Sho-54-145395 and others) are reacted with each other and thereafter, a reaction with pyridine hydrogen halide salt or boron trifluoride is performed to change a methyl group or a benzyl group serving as deprotection to a hydroxyl group, thus enabling production of hydroxyphenoxy phosphazene.

Furthermore, a hydroxy phosphazene compound (1b) can also be produced by a reaction of an alkali meal salt of a hydroxyalkyl phenol such as 2-hydroxymethyl phenol, 3-hydroxymethyl phenol, 4-hydroxymethyl phenol, 4-hydroxyethyl phenol and 4-hydroxybutyl phenol with phosphonitrile chloride.

A hydroxy phosphazene compound (1b) in which plural ones of n $R^1$s and n $R^2$s are hydroxy groups and/or hydroxyalkyl groups is produced only by using at least one selected from the group consisting of alcohol compounds expressed by a formula of $R^3OM$ (in the formula, $R^3$ and M are the same as those of an aminophosphazene compound (1a) described above) and phenol compounds expressed by a formula of $R^4OM$ (in the formula, $R^4$ and M are the same as those of an aminophosphazene compound (1a) described above) together in a reaction between an alkali metal salt of 4-methoxyphenol, or 4-(benzyloxy)phenol in which one hydroxyl group of dihydric phenol is protected by a methyl group or benzyl group and/or an alkali metal salt of a hydroxyalkyl phenol described above, and phosphonitrile chloride.

As examples of compounds in which one hydroxyl group of dihydric phenol is protected by a methyl group or benzyl group, there are named 4-methoxyphenol, 3-methoxyphenol, 2-methoxyphenol, 4-(benzyloxy)phenol and others.

In order to obtain a compound in which all of chlorine atoms of phosphonitrile chloride are substituted with methoxyphenoxy and/or 4-(benzyloxy)phenoxy, a phosphonitrile chloride solution is added to a solution of an alkali metal salt of methoxyphenol or 4-(benzyloxy)phenol to cause a reaction therebetween. This reaction is preferably performed in an organic solvent such as benzene, toluene, xylene, ether, tetrahydrofuran or the like at room temperature for a time of from 1 to 20 hours, followed by the reaction at a reflux temperature of a solvent in use for a time of about 1 to 3 hours for completion thereof. On the other hand, in order to obtain a compound in which part of chlorine atoms of phosphonitrile chloride is substituted with a methoxyphenoxy group and/or a benzylphenoxy group, a solution of an alkali metal salt of methoxyphenol or 4-(benzyloxy)phenol prepared quantitatively so as to leave the other part of chlorine atoms of phosphonitrile chloride unsubstituted during the reaction is added to a phosphonitrile chloride solution with a preferable result. By substituting unsubstituted chlorine atoms of partially substituted phosphonitrile chloride with an alkali metal salt of an alcohol or phenol compound described above, there can be obtained a compound with a methoxyphenoxy or 4-(benzyloxy)phenoxy group and $R^3O$-group and/or $R^4O$-group ($R^3$ and $R^4$ are the same as those in an aminophosphazene compound (1a) described above) as substitutes in a mixed manner. The reaction is preferably caused in conditions of a temperature from room temperature to a reflux temperature or lower of a solvent in use and a time ranging about 3 to about 8 hours. Note that, in this case, a method can be adopted in which a mixed solution of an alkali metal salt of methoxyphenol or 4-(benzyloxy)phenol and an alkali metal salt of alcohol or phenol compound is prepared in advance and a phosphonitrile halide solution is added dropwise to the mixed solution to cause a reaction with a similar effect. Then, a removal reaction of a methyl or a benzyl protective group as a substitute of a methoxyphenoxy group or a benzyloxy group as a substitute is preferably performed in a way that pyridine hydrogen halide salt of a quantity in equivalent about 2 to 20 times, or preferably about 5 to 10 times as large as one equivalent quantity of a methyl or a benzyl protective group is used to cause a reaction at a reflux temperature for about 1 hour or less, while with more than a reaction time of 1 hour, a reaction product decomposes to reduce a yield. As pyridine hydrogen halide salts, there are named pyridine hydrogen chloride salt, pyridine hydrogen bromide salt and others. Removal of a methyl or a benzyl group as a protective group can also be achieved using a reagent such as iodotrimethylsilane, aluminum trichloride, aluminum tribromide, boron trifluoride, boron tribromide, hydrogen bromide, hydrogen iodide and others.

Furthermore, in order to obtain a compound in which all of chlorine atoms of phosphonitrile chloride are substituted with a hydroxyalkylphenoxy group (for example, a hydroxymethylphenoxy group, a hydroxyethylphenoxy group, a hydroxybutylphenoxy group or the like), the compound can be produced in a way that 1.01 to 2.0 equivalents of an alkali metal salt of a hydroxyalkyl phenol is used relative to chlorine of phosphonitrile chloride to cause a reaction preferably in an organic solvent such as benzene, toluene, xylene, ether, tetrahydrofuran or the like at room temperature for a time ranging 1 to 20 hours, followed by the reaction at a reflux temperature of a solvent in use for a time ranging from about 1 to about 3 hours to complete the reaction.

In order to obtain a compound in which part of chlorine atoms of phosphonitrile chlorides substituted with a hydroxyalkylphenoxy group, a solution of an alkali metal salt of hydroxyalkylphenol prepared so as to leave the other part of chlorine atoms of phosphonitrile chloride unsubstituted during the reaction is added to a phosphonitrile halide solution with a preferable result. By substituting unsubstituted chlorine atoms of partially substituted phosphonitrile chloride with an alkali metal salt of an alcohol or phenol compound described above, there can be obtained a compound with a hydroxyalkylphenoxy group and $R^3O$-group and/or $R^4O$-group ($R^3$ and $R^4$ are the same as those in an aminophosphazene compound (1a) described above) as substitutes in a mixed manner. A reaction is preferably caused in conditions of a temperature from room temperature to a reflux temperature or lower of a solvent in use and a time ranging about 3 to about 8 hours. Note that, in this case, a method can be adopted in which a mixed solution of an alkali metal salt of hydroxyalkylphenol and an alkali metal salt of alcohol or phenol compound is prepared in advance and a phosphonitrile halide solution is dropwise added to the mixed solution to cause a reaction with a similar effect.

As concrete examples of hydroxyphosphazene compounds (1b), there can be named, for example, cyclotriphosphazenes with a hydroxyphenoxy group and a phenoxy group as substitutes in a mixed manner such as hydroxyphenoxypentaphenoxycyclotriphosphazene, di(hydroxyphenoxy)-tetraphenoxycyclotriphosphazene, tri (hydroxyphenoxy)-triphenoxycyclotriphosphazene, tetra (hydroxyphenoxy)-diphenoxycyclotriphosphazene, penta (hydroxyphenoxy)-phenoxycyclotriphosphazene, and hexahydroxyphenoxy cyclotriphosphazene; cyclotriphosphazenes with a hydroxymethylphenoxy group and a phenoxy group as substitutes in a mixed manner such as hydroxymethylphenoxypentaphenoxycyclotriphosphazene, di(hydroxymethylphenoxy)-tetraphenoxycyclotriphosphazene, tri (hydroxymethylphenoxy)-triphenoxycyclotriphosphazene, tetra(hydroxymethylphenoxy)-diphenoxycyclotriphosphazene, penta (hydroxymethylphenoxy)-phenoxycyclotriphosphazene, and hexahydroxymethylphenoxy cyclotriphosphazenes; cyclotriphosphazenes with a hydroxyethylphenoxy group and a phenoxy group as substitutes in a mixed manner such as hydroxyethylphenoxy-pentaphenoxycyclotriphosphazene, di(hydroxyethylphenoxy)-tetraphenoxycyclotriphosphazene, tri (hydroxyethylphenoxy)-triphenoxycyclotriphosphazene, tetra(hydroxyethylphenoxy)-diphenoxycyclotriphosphazene, penta (hydroxyethylphenoxy)-phenoxycyclotriphosphazene, and hexahydroxyethylphenoxy cyclotriphosphazenes; cyclotriphosphazenes with a hydroxybutylphenoxy group and a phenoxy group as substitutes in a mixed manner such as hydroxybutylphenoxypentaphenoxycyclotriphosphazene, di(hydroxybutylphenoxy)-tetraphenoxycyclotriphosphazene, tri (hydroxybutylphenoxy)-triphenoxycyclotriphosphazene, tetra(hydroxybutylphenoxy)-diphenoxycyclotriphosphazene, penta (hydroxybutylphenoxy)-phenoxy cyclotriphosphazene, and hexahydroxybutylphenoxy cyclotriphosphazenes.

Furthermore, there are named cyclotriphosphazenes with a hydroxyethylphenoxy group, and a butoxy group, an octyloxy group, trifluoroethoxy group, an octafluoropentyloxy group, an ethylphenoxy group, a naphthyloxy group, an allyloxy group, an allylphenoxy group, a chlorophenoxy group or a trifluoromethylphenoxy group as substitutes in a mixed manner.

Furthermore, there are named cyclotetraphosphazene, cyclopentaphosphazene, cyclohexaphosphazene, a cyclophosphazene mixture (a mixture of cyclophosphazenes of the general formula (1) with n being 3 to 15), a linear phosphazene mixture (a mixture of linear phosphazenes of the general formula (1) with n=3000 on average) and a cyclic (=cyclo) and linear phosphazene mixture (a mixture of cyclic and linear phosphazenes of the general formula (1) with n=1000 on average) each with a hydroxyphenoxy group and a phenoxy group as substitutes in a mixed manner.

Furthermore, there are named cyclotetraphosphazene, cyclopentaphosphazene, cyclohexaphosphazene, a cyclophosphazene mixture (a mixture of cyclophosphazenes of the general formula (1) with n being 3 to 15), a linear phosphazene mixture (a mixture of linear phosphazenes of the general formula (1) with n=3000 on average) and a cyclic (=cyclo) and linear phosphazene mixture (a mixture of cyclic and linear phosphazenes of the general formula (1) with n=1000 on average) each with a hydroxyethylphenoxy group and a phenoxy group as substitutes in a mixed manner. The hydroxyphosphazene compounds may include mixtures of compounds with two or more types of substituents.

Among the above hydroxyphosphazenes, preferable are, for example, hexahydroxyphenoxycyclotriphosphazene; hexahydroxyethylphenoxycyclotriphosphazene; a cyclotriphosphazene with a hydroxyphenoxy group, a hydroxyethylphenoxy group and a phenoxy group as substitutes in a mixed manner; a cyclophosphazene mixture (a mixture of cyclophosphazenes of the general formula (1) with n being 3 to 15) with a hydroxyphenoxy group and a phenoxy group as substitutes in a mixed manner; a linear phosphazene mixture (a mixture of linear phosphazenes of the general formula (1) with n=3000 on average) with a hydroxyethylphenoxy group and a phenoxy group as substitutes in a mixed manner, and especially preferable are a cyclophosphazene mixture (a mixture of cyclophosphazenes of the general formula (1) with n being 3 to 15) with a hydroxyphenoxy group and a phenoxy group as substitutes in a mixed manner and a linear phosphazene mixture (a mixture of linear phosphazenes of the general formula (1) with n=3000 on average) with a hydroxyethylphenoxy group and a phenoxy group as substitutes in a mixed manner.

Glycidylphosphazene Compound (1c)

A glycidyl phosphazene compound (1c) can be produced in a way that a hydroxyphosphazene compound (1b) and epihalohydrin are reacted with each other in a solvent-free condition or in a proper solvent such as dimethyl sulfoxide in the presence of a quaternary ammonium salt such as tetramethyl ammonium chloride, tetramethyl ammonium bromide or the like, an alkali metal hydroxide such as sodium hydroxide, potassium hydroxide or the like. In a case where a quaternary ammonium salt is used, since a reaction is ceased at a stage of a ring opening addition reaction, the above reaction is followed by addition of an alkali metal hydroxide to cause an ring closing reaction. If an alkali metal hydroxide is added at the start of the reaction, the ring opening addition reaction and the ring closing reaction can be performed successively.

As epihalohydrins, there can be used known compounds and the following are named: epichlorohydrin, epibromohydrin, epiiodohydrin and others. A quantity of usage thereof is generally in the range of from 1 to 50 mol and preferably in the range of from 3 to 15 mol per 1 mol of hydroxyl group of hydroxyphosphazene compound (1b).

In a case where dimethyl sulfoxide is used, a quantity of usage thereof has only to be in the range of from 20 to 200 parts by weight relative to 100 parts by weight of epihalohydrin.

A quantity of usage of an alkali metal hydroxide has only to be generally in the range of from 0.8 to 1.5 mol and preferably in the range of from 0.9 to 1.3 mol per 1 mol of hydroxyl group of a hydroxyphosphazene compound (1b). A quantity of usage of a quaternary ammonium salt has only to be generally in the range of 0.001 to 1 mol and preferably in the range of 0.005 to 0.5 mol per 1 mol of a hydroxyl group of a hydroxyphosphazene compound (1b).

The reaction temperature is generally set in the range of from 20 to 130° C. and preferably in the range of from 30 to 100° C. The reaction can also be progressed while water produced during the reaction is removed to outside the reaction system. After the reaction ends, a salt, dimethyl sulfoxide, and others as byproducts are removed by washing with water and epihalohydrin in excess is removed as a distillate, thereby enabling a glycidyl phosphazene compound (1c).

In order to remove an impurity, the obtained glycidyl phosphazene compound (1c) may be dissolved into a solvent such as methylisobutyl ketone or the like to then, cause the solution to be heated at a temperature in the range of from 50 to 100° C. for a time in the range of from 0.5 to 3 hours in the presence of an alkali metal hydroxide such as sodium hydroxide or the like. After the heat treatment, the solution is repeatedly washed with water to cause a water phase to be neutral and a solvent such as methylisobutyl ketone or the like is removed as a distillate under a reduced pressure, thereby obtaining a glycidyl phosphazene compound (1c) with an extremely high purity. In this process, a quantity of usage of an alkali metal hydroxide is in the range of from 0.01 to 0.2 mol per 1 mol of an epoxy group of the glycidyl phosphazene compound (1c) to be processed. By repeating such a process, there can be obtained a glycidyl phosphazene compound (1c) with a much higher purity.

As concrete examples of glycidyl phosphazene compounds (1b), there are named the following compounds, for example, cyclotriphosphazenes with a glycidyloxyphenoxy group and a phenoxy group as substitutes in a mixed manner such as glycidyloxyphenoxy-pentaphenoxycyclotriphosphazene, di(glycidyloxyphenoxy)-tetraphenoxycyclotriphosphazene, tri(glycidyloxyphenoxy)-triphenoxycyclotriphosphazene, tetra(glycidyloxyphenoxy)-diphenoxycyclotriphosphazene, penta(glycidyloxyphenoxy)-phenoxycyclotriphosphazene, and hexaglycidyloxyphenoxy cyclotriphosphazenes; cyclotriphosphazenes with a glycidyloxymethylphenoxy group and a phenoxy group as substitutes in a mixed manner such as glycidyloxymethylphenoxy-pentaphenoxycyclotriphosphazene, di(glycidyloxymethylphenoxy)-tetraphenoxy cyclotriphosphazene, tri(glycidyloxymethylphenoxy)-triphenoxycyclotriphosphazene, tetra (glycidyloxymethylphenoxy)-diphenoxy-cyclotriphosphazene, penta(glycidyloxymethylphenoxy)-phenoxycyclotriphosphazene, and hexaglycidyloxymethylphenoxy cyclotriphosphazenes; cyclotriphosphazenes with a glycidyloxyethylphenoxy group and a phenoxy group as substitutes in a mixed manner such as glycidyloxyethylphenoxy-pentaphenoxycyclotriphosphazene, di(glycidyloxyethylphenoxy)-tetraphenoxy-cyclotriphosphazene, tri(glycidyloxyethylphenoxy)-triphenoxy cyclotriphosphazene, tetra (glycidyloxyethylphenoxy)-diphenoxy-cyclotriphosphazene, penta(glycidyloxyethylphenoxy)-phenoxy cyclotriphosphazene, and hexaglycidyloxyethylphenoxycyclotriphosphazenes; cyclotriphosphazenes with a glycidyloxybutylphenoxy group and a phenoxy group as substitutes in a mixed manner such as glycidyloxybutylphenoxy-pentaphenoxycyclotriphosphazene, di(glycidyloxybutylphenoxy)-tetraphenoxy cyclotriphosphazene, tri(glycidyloxybutylphenoxy)-triphenoxycyclotriphosphazene, tetra (glycidyloxybutylphenoxy)-diphenoxy cyclotriphosphazene, penta(glycidyloxybutylphenoxy)-phenoxy cyclotriphosphazene, and hexaglycidyloxybutylphenoxycyclotriphosphazenes.

Furthermore, there are named cyclotriphosphazenes with a glycidyloxyethylphenoxy group, and a butoxy group, an octyloxy group, a trifluoroethoxy group, an octafluoropentyloxy group, an ethylphenoxy group, a naphthyloxy group, an allyloxy group, an allylphenoxy group, a chlorophenoxy group, a trifluoromethylphenoxy group or the like as substitutes in a mixed manner.

Furthermore, there are named cyclotetraphosphazene, cyclopentaphosphazene, cyclohexaphosphazene, a cyclophosphazene mixture (a mixture of cyclophosphazenes of the general formula (1) with n being 3 to 15), a linear phosphazene mixture (a mixture of linear phosphazenes of the general formula (1) with n=3000 on average) and a cyclic (=cyclo) and linear phosphazene mixture (a mixture of cyclic and linear phosphazenes of the general formula (1) with n=1000 on average) each with a glycidyloxyphenoxy group and a phenoxy group as substitutes in a mixed manner.

Furthermore, there are named cyclohexaphosphazene with a glycidyloxyethylphenoxy group, a glycidyloxyethylphenoxy group, a glycidyloxyethylphenoxy group or the like,and a phenoxy group in a mixed manner, a cyclophosphazene mixture (a mixture of cyclophosphazenes of the general formula (1) with n being 3 to 15) with a glycidyloxyethylphenoxy group and a phenoxy group as substitutes in a mixed manner, a linear phosphazene mixture (a mixture of linear phosphazenes of the general formula (1) with n=3000 on average) with a glycidyloxyethylphenoxy group and a phenoxy group as substitutes in a mixed manner, and a cyclic (=cyclo) and linear phosphazene mixture (a mixture of cyclic and linear phosphazenes of the general formula (1) with n=1000 on average) each with a glycidyloxyethylphenoxy group and a phenoxy group as substitutes in a mixed manner. The glycidyl phosphazene compounds may include mixtures of compounds with two or more types of substituents.

Among the above glycidyl phosphazene compounds, preferable are, for example, hexaglycidyloxyphenoxy cyclotriphosphazene; hexaglycidyloxyethylphenoxy cyclotriphosphazene; cyclotriphosphazene with a glycidyloxyphenoxy group and a phenoxy group as substitutes in a mixed manner; cyclotriphosphazene with a glycidyloxyethylphenoxy group and a phenoxy group as substitutes in a mixed manner; a cyclophosphazene mixture (a mixture of cyclophosphazenes of the general formula (1) with n being 3 to 15) with a glycidyloxyphenoxy group and a phenoxy group as substitutes in a mixed manner; a linear phosphazene mixture (a mixture of linear phosphazenes of the general formula (1) with n=3000 on average) with a glycidyloxyethylphenoxy group and a phenoxy group as substitutes in a mixed manner, and especially preferable are a cyclophosphazene mixture (a mixture of cyclophosphazenes of the general formula (1) with n being 3 to 15) with a glycidyloxyphenoxy group and a phenoxy group as substitutes in a mixed manner and a linear phosphazene mixture (a mixture of linear phosphazenes of the general formula (1) with n=3000 on average) with a glycidyloxyethylphenoxy group and a phenoxy group as substitutes in a mixed manner.

[Polymer of Phosphazene Compound (1)]

As polymers of a phosphazene compound (1), there are named, for example, polymers obtained by polymerization of one type or two or more types of grycidylphosphazene compounds (1c).

Polymer of Grycidylphosphazene Compound (1c)

A polymer of a glycidyl phosphazene compound (1c) is generally obtained by polymerizing a glycidyl phosphazene compound (1c) while heating in a solvent-free condition or in an organic solvent, in the presence of a catalyst such as a Lewis acid including aluminum chloride, boron trifluoride, iron chloride and antimony chloride, an alkali metal hydroxide including sodium hydroxide and potassium hydroxide, an organic aluminum compound including triethyl aluminum and aluminum tributoxide and an organic zinc compound including diethyl zinc and others or in the absence thereof In a case where hexaglycidyloxyphenoxy cyclotriphosphazene is used, for example, a reaction is caused in an organic solvent such as benzene, toluene, xylene, ether or tetrahydrofuran in the presence of potassium hydroxide as a catalyst at a temperature in the range of from 50° C. to a reflux temperature of a solvent in use for a time in the range of from 1 to 20 hours and thereafter, the solvent and the catalyst used in the reaction are removed through operations such as concentration, washing and others, thereby obtaining the target compound.

As concrete examples of polymers of a glycidyl phosphazene compound (1c), there are named the following polymers, for example, oligo or poly(glycidyloxyphenoxy-pentaphenoxy cyclotriphosphazene), oligo or poly(tri (glycidyloxyphenoxy)-triphenoxycyclotriphosphazene), oligo or poly(hexaglycidyloxyphenoxy-cyclotriphosphazene); oligo or poly (glycidyloxyethylphenoxy-pentaphenoxy cyclotriphosphazene), oligo or poly(tri (glycidyloxyethylphenoxy)-triphenoxy cyclotriphosphazene), oligo or poly (hexaglycidyloxyethylphenoxycyclotriphosphazene), a polymer of a cyclophosphazene mixture (a mixture of cyclophosphazenes of the general formula (1) with n being 3 to 15) with a glycidyloxyphenoxy group and a phenoxy group as substitutes in a mixed manner, a polymer of a cyclophosphazene mixture (a mixture of cyclophosphazenes of the general formula (1) with n being 3 to 15) with a glycidyloxyethylphenoxy group and a phenoxy group as substitutes in a mixed manner, a polymer of a cyclic (=cyclo) and linear phosphazene mixture (a mixture of cyclic and linear phosphazenes of the general formula (1) with n being 1000 on average) with a glycidyloxyphenoxy group and a phenoxy group as substitutes in a mixed manner and, and a polymer of a cyclic (=cyclo) and linear phosphazene mixture (a mixture of cyclic and linear phosphazenes of the general formula (1) with n being 1000 on average) with a glycidyloxyethylphenoxy group and a phenoxy group. as substitutes in a mixed manner.

Among the polymers, preferable are oligo or poly (glycidyloxyphenoxypentaphenoxycyclotriphosphazene), oligo or poly (glycidyloxyethylphenoxypentaphenoxycyclotriphosphazene), a polymer of a cyclophosphazene mixture (a mixture of cyclophosphazenes of the general formula (1) with n being 3 to 15) with a glycidyloxyphenoxy group and a phenoxy group as substitutes in a mixed manner, a polymer of a cyclophosphazene mixture (a mixture of cyclophosphazenes of the general formula (1) with n being 3 to 15) with a glycidyloxyethylphenoxy group and a phenoxy group as substitutes in a mixed manner, and especially preferable are a polymer of a cyclophosphazene mixture (a mixture of cyclophosphazenes of the general formula (1) with n being 3 to 15) with a glycidyloxyphenoxy group and a phenoxy group as substitutes in a mixed manner, a polymer of a cyclophosphazene mixture (a mixture of cyclophosphazenes of the general formula (1) with n being 3 to 15) with a glycidyloxyethylphenoxy group and a phenoxy group as substitutes in a mixed manner and others.

[Reaction Compound between Phosphazene Compound (1) and Other Compounds]

As reaction compounds of a phosphazene compound (1) with at least one type of compound selected from the group consisting of an epoxy compound, a phenol compound, an amine compound and an acid anhydride (the compounds are hereinafter referred collectively to as a reactive group containing compound unless otherwise specified), there are named the following copolymers, for example, a copolymer obtained by polymerizing an aminophosphazene compound (1a) and/or a hydroxyphosphazene compound (1b) with an epoxy compound, a copolymer obtained by polymerizing a glycidylphosphazene compound (1c) with a reactive group containing compound and others.

[Copolymer of Aminophophazene Compound (1a) and/or Hydroxyphosphazene Compound (1b) with Epoxy Compound]

Copolymerization of an aminophosphazene compound (1a) and/or a hydroxyphosphazene compound (1b) with an epoxy compound is performed, for example, by heating in an organic solvent or in a solvent-free condition in the presence or absence of a curing catalyst. In a case where hexaaminophenoxy cyclotriphosphazene or hexahydroxyphenoxy cyclotriphosphazene reacts with diglycidyl ether of bisphenol A, for example, a reaction has only to be caused in an organic solvent such as benzene, toluene, xylene, ether, tetrahydrofuran or the like using potassium hydroxide as a curing catalyst at a temperature in the range of from 50° C. to a reflux temperature of a used solvent for a time in the range of from 1 to 20 hours and after the reaction ends, the solvent and the used catalyst are removed by operations such as concentration, washing and others, thereby enabling a desired copolymer to be obtained.

As epoxy compounds, there can be used an epoxy resin and a monomer for an epoxy resin. Epoxy resins can be the same as the known epoxy resins described above. Known monomers can be used as a monomer for epoxy resin and there can be named, for example, bifunctional epoxy compounds such as ethylene glycol diglycidyl ether, propylene glycol diglycidyl ether, tripropylene glycol diglycidyl ether, 1,6-hexanediol diglycidyl ether, diglycidyl ether of bisphenol A, butadiene diepoxide, 3,4-epoxycyclohexylmethyl-(3, 4-epoxy)cyclohexane carboxylate, vinylcyclohexane dioxide, 4,4',-di(1,2-epoxyethyl)diphenyl ether, 4,4'-(1,2-epoxyethyl)biphenyl, 2,2-bis(3,4-epoxycyclohexyl) propane, glycidyl ether of resorcinol, diglycidyl ether of phloroglucin, diglycidyl ether of methyl phloroglucin, bis (2,3-epoxycyclopentyl) ether, 2(3,4-epoxy)cyclohexane-5, 5spiro(3, 4-epoxy)cyclohexane-m-dioxane, bis(3,4epoxy-6-methylcyclohexyl)adipate, N,N'-m-phenylenebis(4,5-epoxy-1,2cyclohexane)dicarboxyimide; tri- or higher functional epoxy compounds such triglycidyl ether of p-aminophenol, polyallyl glycidyl ether, 1,3,5-tri(1,2-epoxyethyl)benzene, 2,2',4,4'-tetraglycidoxybenzophenone, polyglycidyl ether of phenol formaldehyde novolak, triglycidyl ether of trimethylolpropane and others. Epoxy resins and monomers thereof are used singly or in a combination of two or more thereof.

As concrete examples of copolymers between an aminophosphazene compounds (1a) and an epoxy compound, there are named the following copolymers, for example, between epoxy compounds such as diglycidyl ether of bisphenol A, 4,4'-(1,2-epoxyethyl)biphenyl, 2,2bis(3,4-epoxycyclohexyl)propane, glycidyl ether of resorcinol, diglycidyl ether of fluoroglucin or the like; and hexaaminophenoxy cyclotriphosphazene, hexaaminoethylphenoxy cyclotriphosphazene, a cyclotriphospazene with an aminophenoxy group and a phenoxy group as substitutes in a mixed manner, a cyclotriphospazene with an aminoethylphenoxy group and a phenoxy group as substitutes in a mixed manner, a cyclophosphazene mixture (a mixture of cyclophosphazenes of the general formula (1) with n being 3 to 15) with an aminophenoxy group and a phenoxy group as substitutes in a mixed manner, a linear phosphazene mixture (a mixture of linear phosphazenes of the general formula (1) with n=3000 on average) with an aminoethylphenoxy group and a phenoxy group as substitutes in a mixed manner or the like. The copolymers can be used singly or in a combination of two or more thereof. In a reaction between an aminophosphazene compound (1a) and an epoxy compound, a terminal end of a copolymer produced from the reaction may be an amino group or an epoxy group according to a quantitative relation therebetween.

As concrete examples of copolymers between a hydroxyphosphazene compounds (1b) and an epoxy compound, there are named the following copolymers, for example, between hexahydroxyphenoxy cyclotriphosphazene, hexahydroxyethylphenoxy cyclotriphosphazene, a cyclotriphospazene with a hydroxyphenoxy group and a phenoxy group as substitutes in a mixed manner, a cyclotriphosphazene with a hydroxyethylphenoxy group and a phenoxy group as substitutes in a mixed manner, a cyclophosphazene mixture (a mixture of cyclophosphazenes of the general formula (1) with n being 3 to 15) with a hydroxyphenoxy group and a phenoxy group as substitutes in a mixed manner, a linear phosphazene mixture (a mixture of linear phosphazenes of the general formula (1) with n being 3000 on average) with a hydroxyphenoxy group and a phenoxy group as substitutes in a mixed manner or the like; and diglycidyl ether of bisphenol A, 4,4'-(1,2-epoxyethyl) biphenyl, 2,2bis(3,4-epoxycyclohexyl)propane, glycidyl ether of resorcinol, diglycidyl ether of phloroglucin or the like. The copolymers can be used singly or in a combination of two or more thereof. In a reaction between a cyclic hydroxyphosphazene compound (1b) and an epoxy compound, a terminal end of a copolymer produced from the reaction may be a hydroxy group or an epoxy group according to a quantitative relation therebetween.

[Copolymer of Glycidylphophazene Compound (1c)) with Reactive Group Containing Compound]

A copolymer between a glycidylphosphazene compound (1c) and a reactive group containing compound can be produced by a reaction of a glycidylphosphazene compound (1c) with a reactive group containing compound.

As epoxy compounds, there can be used epoxy compounds similar to those used in a case of production of a copolymer between an aminophosphazene compound (1a) and/or a hydroxyphosphazene compound (1b) and an epoxy compound. Herein as well, epoxy compounds can be used singly or in a combination of two or more thereof. As concrete examples of copolymers between a glycidylphosphazene compounds (1c) and an epoxy compound, there are named the following copolymers, for example, between diglycidyl ether of bisphenol A, or glycidyl ether of 4,4'-(1,2-epoxyethyl)biphenyl, 2,2bis(3,4-epoxycyclohexyl) propane or resorcinol, or diglycidyl ether of phloroglucin or the like; and hexaglycidylphenoxy cyclotriphosphazene, hexaglycidylethylphenoxy cyclotriphosphazene, a cyclotriphosphazene with a glycidyloxyphenoxy group and a phenoxy group as substitutes in a mixed manner, a cyclotriphosphazene with a glycidyloxyethylphenoxy group and a phenoxy group as substitutes in a mixed manner, a cyclophosphazene mixture (a mixture of cyclophosphazenes of the general formula (1) with n being 3 to 15) with a glycidyloxyphenoxy group and a phenoxy group as substitutes in a mixed manner, a linear phosphazene mixture (a mixture of linear phosphazenes of the general formula (1) with n=3000 on average) with a glycidyloxyphenoxy group and a phenoxy group as substitutes in a mixed manner or the like. In the copolymers, a terminal end of each polymer may be a phosphazene compound or an epoxy compound. These copolymers can be used singly or in a combination of two or more thereof.

As concrete examples of copolymers between a glycidylphosphazene compound (1c) and a phenol compound, there are named the following copolymers, for example, between resins obtained by condensation of bisphenol A, bisphenol F, dihydroxynaphthalene, phenol, cresol or xylenol and formaldehyde in the presence of an acidic catalyst, p-vinyl phenol resin, triphenolmethane condensate or the like; and hexaglycidylphenoxy cyclotriphosphazene, hexaglycidylethylphenoxy cyclotriphosphazene, a cyclotriphospazene with a glycidyloxyphenoxy group and a phenoxy group as substitutes in a mixed manner, a cyclotriphospazene with a glycidyloxyethylphenoxy group and a phenoxy group as substitutes in a mixed manner, a cyclophosphazene mixture (a mixture of cyclophosphazenes of the general formula (1) with n being 3 to 15) with a glycidyloxyphenoxy group and a phenoxy group as substitutes in a mixed manner, a linear phosphazene mixture (a mixture of linear phosphazenes of the general formula (1) with n being 3000 on average) with a glycidyloxyphenoxy group and a phenoxy group as substitutes in a mixed manner or the like. In the copolymers, a terminal end of each polymer may be a glycidyl group or a hydroxy group. The copolymers can be used singly or in a combination of two or more thereof.

As amine compounds, there may be named the following compounds such as diethylenetriamine, triethylenetetramine, tetraethylenepentamine, diethylaminopropylamine, polyamidepolyamine, menthenediamine, isophrone diamine, N-aminoethylpiperazine, bis(4-amino-3-methylcyclohexyl) methane, bis(4-aminocyclohexyl)methane, m-xylenediamine, diaminodiphenylmethane, diaminodiphenylsulfone, m-phenylenediamine, dicyandiamide, adipic acid dihydrazide, 3,9-bis(3-aminoporpyl)-2,4,8,10-tetraoxaspiro(5,5)undecane adduct and others. The amine compounds can be used singly or in a combination of two or more thereof.

As concrete examples of copolymers between a glycidylphosphazene compound (1c) and an amine compound, there are named the following copolymers, for example, between an amine compound such as tetraethylenepentamine, m-xylenediamine, diaminodiphenylmethane, diaminodiphenylsulfone, m-phenylenediamine, dicyandiamide or the like; and hexaglycidylphenoxy cyclotriphosphazene, hexaglycidylethylphenoxy cyclotriphosphazene, a cyclotriphospazene with a glycidylphenoxy group and a phenoxy group as substitutes in a mixed manner, a cyclotriphospazene with a glycidylethylphenoxy group and a phenoxy group as substitutes in a mixed manner, a cyclophosphazene mixture (a mixture of cyclophosphazenes of the general formula (1) with n being 3 to 15) with a glycidylphenoxy group and a phenoxy group as substitutes in a mixed manner, a linear phosphazene mixture (a mixture of linear phosphazenes of the general formula (1) with n=3000 on average) with a glycidylphenoxy group and a phenoxy group as substitutes in a mixed manner or the like. In the copolymers, a terminal end of each polymer may be a glycidyl group or an amino group. The copolymers can be used singly or in a combination of two or more thereof.

As acid anhydrides, there are named the following anhydrides, for example, phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chlorendic anhydride, pyromellitic anhydride, benzophenonetetracarboxylic anhydride, ethyleneglycol bis (anhydrotrimate), methylcyclohexanetetracarboxylic anhydride, trimellitic anhydride, polyazelaic anhydride and others. The anhydrides can be used singly or in a combination of two or more thereof. As concrete examples of copolymers between a glycidylphosphazene compound (1c) and an acid anhydride, there are named the following copolymers, for example, between tetrahydrophthalic anhydride, hexahydrophthalic anhydride, methyltetrahydrophthalic anhydride, methylhexahydrophthalic anhydride, pyromellitic anhydride, benzophenonetetracarboxylic anhydride, methylcyclohexanetetracarboxylic anhydride or the like; and hexaglycidylphenoxy cyclotriphosphazene, hexaglycidylethylphenoxy cyclotriphosphazene, a cyclotriphosphazene with a glycidyloxyphenoxy group and a phenoxy group as substitutes in a mixed manner, a cyclotriphosphazene with a glycidyloxyethylphenoxy group and a phenoxy group as substitutes in a mixed manner, a cyclophosphazene mixture (a mixture of cyclophosphazenes of the general formula (1) with n being 3 to 15) with a glycidyloxyphenoxy group and a phenoxy group as substitutes in a mixed manner, a linear phosphazene mixture (a mixture of linear phosphazenes of the general formula (1) with n=3000 on average) with a glycidyloxyphenoxy group and a phenoxy group as substitutes in a mixed manner or the like. In the copolymers, a terminal end of each polymer may be a glycidyl group or an acid residue. The copolymers can be used singly or in a combination of two or more thereof.

(C) Component: Epoxy Hardener

As epoxy hardeners, there are named a compound having a phenolic hydroxyl group, an aromatic amine compound, an acid anhydride and others. Among them, preferable is a compound having a phenolic hydroxyl group in consideration of moisture resistance, moldability, storage stability and others. As compounds each having a phenolic hydroxyl group, there are named, without a specific limitation imposed on compounds as far as the compounds show a curing action exerted to an epoxy resin, for example, resins obtained by condensation or co-condensation of a phenol such as phenol, cresol, xylenol, resorcinol, catechol, bisphenol A or bisphenol F, or a naphthol such as $\alpha$-naphthol, $\beta$-naphthol or dihydroxynaphthalene with an aldehyde such as formaldehyde, acetaldehyde, propionaldehyde, benzaldehyde or salicylaldehyde in the presence of an acidic catalyst, p-vinyl phenol resin, phenol-aralkyl resin having a xylylene group, synthesized from a phenol and dimethoxy-p-xylene, dicyclopentadiene-modified phenol resin, triphenolmethane condensate and others. These can be used singly or in a combination of two or more thereof.

(D) Components: Inorganic Filler

An inorganic filler has a characteristic not only to enhance a dripping preventive effect of a resin composition but to also improve a mechanical strength thereof As inorganic filler, while any of inorganic filler commonly used in this field can be employed, there can be named the following: for example, powder of fused silica, crystal silica, alumina, aluminum hydroxide, magnesium hydroxide, zinc oxide, zinc borate, zircon, antimony trioxide, talc, calcium silicate, calcium carbonate, silicon carbide, boron carbide, beryllia, zirconia, titanium white, clay, mica, talc and others; beads produced from the above powder; kaolin, barium sulfate, barium carbonate, calcium sulfate, titanium oxide, glass beads, glass balloons, glass flakes, fibrous alkali metal titanate (sodium titanate fibers and others), fibrous borate (aluminum borate fibers, magnesium borate fibers and others), zinc oxide fibers, titanium oxide fibers, magnesium oxide fibers, gypsum fibers, aluminum silicate fibers, calcium silicate fibers, silicon carbide fibers, titanium carbide fibers, titanium nitride fibers, carbon fibers, alumina-silica fibers, zirconia fibers, quartz fibers, thin titanate flakes, thin titanium dioxide flakes and others. The inorganic filler can be used singly or in a combination of two or more thereof.

[Compounding Proportions of Components]

Compounding proportions of components (A) to (D) described above in a composition of the present invention meet the following relation, in which, as to components of an epoxy resin (A), a phosphazene compound (B), an epoxy hardener (C) and an inorganic filler (D), the component (B) has only to be in the range of from 0.01 to 70% by weight and preferably in the range of from 0.1 to 60% by weight and the component (B) has only to be in the range of from 0 to 70% by weight and preferably in the range of from 0 to 60% by weight relative to a total quantity of the components (A) to (C), and the component (D) has only to be in the range of from 0 to 95% by weight and preferably in the range of from 0 to 90% by weight relative to a total quantity of the components (A) to (D).

A type of epoxy resin and types of other components used together have only to be selected within the ranges of compounding quantities described above giving consideration to performance required of a target flame-retardant epoxy resin composition, a type of a laminate manufactured using the flame-retardant epoxy resin composition, types of an encapsulating material and a material of a casting mold, and an effect of further improving performance of flame retardance, moisture resistance, soldering heat resistance, mechanical properties and moldability of a flame-retardant epoxy resin composition to be obtained.

While no specific limitation is placed on an equivalent ratio of an epoxy resin (A) and a functional group of a component (C) (the number of groups of (C)/the number of epoxy groups of (A)), the ratio is preferably set in the range of from 0.7 to 1.3 in order to suppress respective unreacted portions low.

Since a phosphazene compound as a (B) component works not only as a flame retardant but also as an epoxy resin or an epoxy hardener, an equivalent ratio of an epoxy resin as a component (A), a phosphazene compound as a component (B) and a functional group of an epoxy hardener as a component (C) are preferably all set in the range of from 0.7 to 1.3.

Preferred embodiments of a flame-retardant epoxy resin composition of the present invention will be shown below.

(1) A flame-retardant epoxy resin composition in which as to components of an epoxy resin (A) and a phosphazene compound (B), the phosphazene compound component (B) is compounded in the range of from 0.01 to 70% by weight (and preferably in the range of from 0.1 to 60% by weight) relative to a total quantity of the components (A) and (B).

(2) A flame-retardant epoxy resin composition in which as to components of an epoxy resin (A), a phosphazene compound (B) and an epoxy hardener (C), the phosphazene compound component (B) is compounded in the range of from 0.01 to 70% by weight (and preferably in the range of from 0.1 to 60% by weight) and the epoxy hardener component (C) is compounded in the range of from 0 to 70% by weight (and preferably in the range of from 0 to 60% by weight) relative to a total quantity of the components (A), (B) and (C).

(3) A flame-retardant epoxy resin composition in which as to components of an epoxy resin (A), a phosphazene compound (B), an epoxy hardener (C) and an inorganic filler (D), the phosphazene compound component (B) is compounded in the range of from 0.01 to 70% by weight (and preferably in the range of from 0.1 to 60% by weight), the epoxy hardener component (C) is compounded in the range of from 0 to 70% by weight (and preferably in the range of from 0 to 60% by weight) relative to a total quantity of the components (A), (B) and (C); and the inorganic filler component (D) is compounded in the range of from 0 to 95% by weight (and preferably in the range of from 0 to 90% by weight) relative to a total quantity of the components (A), (B). (C) and (D).

(4) A flame-retardant epoxy resin composition in which a polymer of a cyclic and/or a chain phosphazene compound of the general formula (1) is compounded as a phosphazene compound (B) in any one of the flame-retardant epoxy resin compositions (1), (2) and (3)

(5) A flame-retardant epoxy resin composition obtained by compounding any one of the flame-retardant epoxy resin compositions (1), (2), (3) and (4) into a thermoplastic resin and/or a thermoset resin.

[Other Components]

A curing accelerator may be included in a flame-retardant epoxy resin composition of the present invention in addition to the above components. As curing accelerators, there can be used accelerators known in this field and there can be named the following, for example, basic active hydrogen compounds such as dicyandiamide and adipic acid hydrazide; bicycloamidines such as 1,8-diazabicyclo(5,4,0) undecene-7 and 1,5-diazabycyclo(3,4,0)nonene-5, and derivatives such as phenolates thereof, octyl salts thereof and oleic acid salts thereof, oxyalkylamines such as triethanolamine, tetramethylbutanediamine, tetramethylpentanediamine, tetramethylhexanediamine, triethylenediamine, dimethylaniline, benzyl dimethylamine, dimethylaminoethanol and dimethylaminopentanol; tertiary amines such as tris(dimethylaminomethyl)phenol, N-methylmorpholine and N-ethylmorpholine; imidazoles such as 2-methylimidazole, 2-ethylimidazole, 2-phenylimidazole, 2-undecylimidazole, 2-heptadecylimidazole, 2-methyl-4-ethylimidazole, 2-phenyl-4-methylimidazole, 1-butylimidazole, 1propyl-2-methylimidazole, 1bezyl-2-methylimidazole, 1-cyanoethyl-2-methylimidazole, 1-cyanoethyl-2-undecylimidazole, 1-cyanoethyl-2-phenylimidazole, 1-azine-2-methylimidazole and 1-azine-2-uindecylimidazole; quaternary ammonium salts such as cetyl trimethyl ammonium bromide, cetyl trimethyl ammonium chloride, dodecyl trimethyl ammonium iodide, trimethyl decyl ammonium chloride, benzyl dimethyl tetradecyl ammonium chloride, benzyl methyl palmityl ammonium chloride, allyl dodecyl trimethyl ammonium bromide and benzyl dimethyl tetradecyl ammonium acetate; organic phosphines such as tributyl phosphine, methyl diphenyl phosphine and triphenyl phosphine; and tetraphenyl borates such as triphenylphosphine tetraphenyl borate, tetraphenylphosphonium tetraphenyl borate, triethylamine tetraphenyl borate, N-methylmorpholine tetraphenyl borate, 2-ethyl-4-methylimidazole tetraphenyl borate and 2-ethyl-1,4-dimethylimidazole tetraphenyl borate. The curing accelerators can be used singly or in a combination of two or more thereof.

Fluororesin and others can be compounded into a flame-retardant epoxy resin composition of the present invention for the purpose to improve flame-retardant performance, especially dripping (fire spreading due to dripping in burning) preventive performance to a higher level. As fluororesin, there can be used known fluororesin which are named, for example, polytetrafluoroethylene (PTFE), tetrafluoroethylene-hexafluoropropylene copolymer (FEP), tetrafluoroethylene-perfluoroalkylvinylether copolymer (PFA), tetrafluoroethylene-ethylene copolymer (ETFE), poly(trifluorochloroethylene) (CTFE), polyfluorovinylidene (PVdF) and others. Among them, preferable is PTFE. Fluororesins can be used singly or in a combination of two or more thereof. No specific limitation is placed on a compounding quantity of fluororesin and in a case of a composition of the present invention consisting of an epoxy resin (A), a phosphazene compound (B) and an epoxy hardener (C), a compounding quantity of fluororesin is generally on the order in the range of from 0.01 to 2.5% by weight and preferably on the order in the range of from 0.1 to 1.2% by weight relative to a total quantity of the epoxy resin (A), the phosphazene compound (B) and the epoxy hardener (C), though a compounding quantity thereof can be properly selected in a wide range according to various conditions such as a type of an epoxy resin, a quantity of usage of a flame retardant, types and compounding quantities of other additive agents, an application for a flame-retardant resin composition to be obtained.

Various types of additive agents can be compounded into a flame-retardant epoxy resin composition of the present invention in a range in which preferable characteristics thereof are not lost at any degree. As the additive agents, there are named, for example, the curing accelerator, natural waxes, synthetic waxes, straight-chain aliphatic acids and salts thereof, acid amides, esters, release agents such as paraffins, phosphazene compounds other than phosphazene compounds as the components (B) of the present invention, phosphate esters, condensed phosphate esters, other organic phosphorus compounds; flame retardants such as phosphorus as an element, red phosphorus, chlorinated paraffin, brominated toluene, hexabromobenzene, antimony trioxide and other inorganic flame retardants; colorants such as carbon black and red iron oxide; and coupling agents (silane coupling agents such as 3-glycidoxypropyltrimethoxy silane and titanium based coupling agents such as tetraoctylbis (phosphite)titanate and others). The additives can be used singly or in a combination of two or more thereof.

General resin additive agents can further be compounded into a flame-retardant epoxy resin composition of the present invention in a range in which preferable characteristics thereof are not lost at any degree. While no specific limitation is imposed thereon, there are named, for example, ultraviolet absorbents such as benzophenone based, benzotriazole based, cyanoacrylate based, triazine based and others, a light stabilizing agent such as hindered amine based, anti-oxidants such as hindered phenol, organic phosphorus based peroxide decomposing agent, organic sulfur based peroxide decomposing agent; light intercepting agents such as rutile type titanium oxide, zinc oxide, chromium oxide, cerium oxide and others; metal deactivating agents such as benzotriazole based and others; quenching agents such as organic nickel compound and others; an anti-cloudness agent, an anti-mold agent, an antibacterial agent, pigments and others.

A flame-retardant epoxy resin composition of the present invention can be produced by mixing and/or kneading prescribed quantities or proper quantities of an epoxy resin (A), a phosphazene compound (B), an epoxy hardener (C), an inorganic filler (D) and, when required, furthermore, fluororesin and other flame retardants according to a known method. Mixing of the components have only to be performed in a proper sequence of operations, and two or more types among mixed component composites and single components may be mixed to one compound prior to the usage.

As flame retardants for other synthetic resins, there may be used one type or two or more types of polymers selected from the group consisting of the phosphazene compounds (1) and one type or two or more types selected from the group consisting of reaction products obtained from a reaction of a phosphazene compound (1) with a reactive group containing compound. As the synthetic resins, no specific limitation is placed thereon but there can be used any one of known thermoplastic resin and/or thermoset resin. As concrete examples of thermoplastic resins, there are named the following resins: polyethylene, polypropylene, polyisoprene, chlorinated polyethylene, polyvinyl chloride, polybutadiene, polystyrene, high-impact polystyrene, acrylonitrile-styrene resin (AS resin), acrylonitrile-butadiene-styrene resin (ABS resin), methyl methacrylate-butadiene-styrene resin (MBS resin), methyl methacrylate-acrylonitrile-butadiene-styrene resin (MABS resin), acrylonitrile-acrylic rubber-styrene resin (AAS resin), poly (methyl (meta)acrylate), polyester (polyethylene terephthalate, polybutylene terephthalate, polyethylene naphthalate and others), polycarbonate, polyphenylene ether (PPE), modified polyphenylene ether, polyamide (aliphatic and/or aromatic), polyphenylene sulfide, polyimide, poly (ether ether ketone), polysulfone, polyallylate, poly(ether ketone) poly(ether nitrile), poly(thioether sulfone), poly (ether sulfone), polybenzimidazole, polycarbodiimide, polyamidimide, poly(etherimide), a liquid crystal polymer and others. Among them, preferable are polyester, ABS resin, polycarbonate, modified polyphenylene ether, polyamide and others. As concrete examples of thermoset resins, there are named the following resins: for example, polyurethane, phenol resin, melamine resin, bismaleimide-triazine resin, urea resin, unsaturated polyester resin, diallyl phthalate resin, silicone resin, epoxy resin (bisphenol-A epoxy resin, bisphenol-F epoxy resin, bisphenol-AD epoxy resin, phenol novolak epoxy resin, cresol novolak epoxy resin, cycloaliphatic epoxy resin, glycidyl ester based epoxy resin, glycidyl amine based epoxy resin, heterocyclic epoxy resin, urethane-modified epoxy resin, brominated bisphenol-A epoxy resin and others) and others. Among them, preferable are polyurethane, phenol resin, melamine resin, epoxy resin and others and especially preferable is epoxy resin. The thermoplastic resins and the thermoset resins each are employed singly or in a combination of two or more thereof. No specific limitation is placed on a compounding quantity of a flame retardant into a synthetic resin, but the flame retardant quantity thereof is generally on the order in the range of from 0.01 to 100 parts by weight and preferably on the order in the range of from 0.5 to 60 parts by weight relative to 100 parts by weight of a synthetic resin, though a compounding quantity thereof can be properly selected in a wide range according to various conditions such as types of a synthetic resin and a flame retardant, a type and a compounding quantity of another additive agent, required performance, an application and others of a resin composition to be obtained. In the resin composition, there can be compounded one type or two or more types of additive agents selected from the group consisting of the components shown in the section of [Inorganic filler] and the various additives shown in the section of [Other components]. The resin composition can be produced by mixing and/or kneading a synthetic resin, a flame retardant and when required, other additive agents. Furthermore, molded articles of various shapes can be formed using common molding means for synthetic resin.

Moreover, a flame-retardant epoxy resin composition of the present invention may be compounded into one of the various types of synthetic resin described above to produce a new flame-retardant resin composition.

In a case where a flame-retardant epoxy resin composition of the present invention is compounded into a thermoplastic and/or a thermoset resin, a mixture composed of various types of components in the form of powder, beads, flakes or pellets has only to be mixed and/kneaded into a compound using an extruder such as a single screw extruder, a double screw extruder or the like, a Banbury mixer, a pressure kneader, or a kneader with a twin-roll type or the like. Then, a molded article of any shape can be produced according to a known molding method such as press molding, injection molding, extrusion molding, casting or the like.

[Applications]

An flame-retardant epoxy resin composition of the present invention thus obtained can be applied to various types of fields where a synthetic resin can be used and used especially as electronic part materials such as laminate material, encapsulating material, optical material, casting material and others in fields of electrical, electronic and communication equipment, and precision equipment. Furthermore, a flame-retardant epoxy resin composition of the present invention can be applied in common ways of usage of an epoxy resin such as paint, adhesive agent, a transportation vehicle and equipment, fiber products, various types of fabrication machines, food packaging films and a vessel, articles associated with agriculture, forest and fishery, materials for civil engineering and building, medical supplies, components of furniture; composite material for aerospace use and others.

More detailed description will be given for applications as electronic parts in fields of electrical, electronic and communication equipment, and precision equipment.

(1) Prepreg and Copper Clad Laminate

A flame-retardant epoxy resin composition of the present invention is used in paper base copper clad laminate, a glass cloth base copper clad laminate, composite copper clad laminate, a flexible copper clad laminate and others to construct an electronic part. A laminate can be fabricated using a known method. For example, a process goes this way: a proper sheet-like substrate such as glass cloth is impregnated with a varnish including a flame-retardant epoxy resin composition of the present invention to form a prepreg and thereafter, prepregs are used to fabricate a copper clad laminate or the like.

As sheet like substrates for use in preparation of prepreg, substrates that are commonly used in this field can be used, which are named, for example,: glass woven cloth, glass non-woven cloth and cloth composed of components other than a glass such as paper or aramid fibers.

A varnish used for fabricating a prepreg can be prepared by dissolving an epoxy resin composition of the present invention into an organic solvent. As organic solvents, no specific limitation is imposed thereon as far as an epoxy resin composition of the present invention can be dissolved thereinto, which are named, for example, toluene, xylene, acetone, methylethyl ketone, methylisobutyl ketone, N,N,- dimethylformamide, N-methylpyrrolidone, dimethyl sulfoxide, trichloroethylene, trichloroethane, methylene chloride, dioxane, ethyl acetate and others. Furthermore, various types of coupling agents may be added into a varnish in order to improve a close adherence ability on a sheet-like substrate.

One to several prepregs obtained are placed between two copper foils and the prepregs with the two copper foils are hot pressed at a temperature of the order between 100 to 250° C. under pressure between 0.1 to 10 MPa to mold, thereby fabricating a double sided copper clad substrate for conductive circuit formation. After a circuit pattern is formed on the double sided substrate, a necessary number of double sided copper clad substrates are placed between the prepreg sheets, and the substrates and the sheets are hot pressed at a temperature of the order between 100 to 250° C. under a pressure between 0.1 to 10 MPa for adhesion-molding to obtain a multilayer board. After the adhesion-molding, holes for interlayer conduction are formed in the multilayer board, the holes are copper plated to achieve interlayer conduction and a conductor of the outermost layer is formed, thereby enabling a copper laminate to be obtained.

(2) Build-Up Type Multilayer Printed Wiring Board

A flame-retardant epoxy resin composition of the present invention is used as materials of a build-up type multilayer printed wiring board, for example, materials of an interlayer insulating film, a solder resist, a resin coated copper foil and others to construct an electronic part.

To be concrete, a flame-retardant epoxy resin composition of the present invention and other components when required are at first dissolved into a proper organic solvent such as toluene, methylethyl ketone, methylcellosolve or the like to prepare a varnish, the varnish is applied on a copper foil or a carrier film such as made of polyester or polyimide to dry the varnish coat by heating and to thereby semi-harden the coat, which is a common method, thus fabricating a carrier-provided resin film. Then, carrier-provided resin films are, according to a common method, laminated on an inner layer circuit sheet (a glass epoxy laminate) serving as a core by heating under pressure with a laminator, one of various types, to obtain a build-up type multilayer printed wiring board.

In a case where a component to be cured by energy rays such as ultraviolet rays or electron rays is contained in a flame-retardant epoxy resin composition of the present invention, the composition can be used as solder resist material (solder resist ink) capable of developing and printing.

(3) Adhesive Agent and Flexible Printed Wiring Board

By applying a flame-retardant epoxy resin composition of the present invention on a heat resistant resin film or a conductive foil as an adhesive agent for a electronic part, there can be obtained a flexible printed wiring board such as a single sided flexible printed wiring board, a double sided flexible printed wiring board, a multilayer flexible printed wiring board and others. As heat resistant resin films, while no specific limitation is placed thereon as far as the films are self-extinguishing and contain no halogen, there are named polyimide film, polyethyleneterephthalate film, polyethylenenaphthalate film and others among which a polyimide film is especially preferable from the viewpoint of heat resistance, mechanical properties, electrical characteristics, a flame retardance and others. As conductive foils, there are named a copper foil, an aluminum foil, a nickel foil, a stainless foil, alloy foils such as an iron-nickel foil and others, among which a copper foil is especially preferable in an aspect of flexibility, electrical characteristics, machinability and others.

(4) Anisotropic Conductivity Material

A flame-retardant epoxy resin composition of the present invention is used in an adhesive agent with anisotropic conductivity, a sheet with anisotropic conductivity, a film with anisotropic conductivity, a paste material with anisotropic conductivity and the like for use in electrical connection of a finely patterned circuit of a liquid crystal display (LCD) and a tape carrier package (TCP), TCP and a printed circuit substrate (PCB) and others, thus constructing an electronic part.

(5) Semiconductor Encapsulating Material and Opto-Device Encapsulating Material

A flame-retardant epoxy resin composition of the present invention is used in a semiconductor encapsulating material and an opto-device encapsulating material, for example film semiconductor encapsulating material, high thermal conductivity semiconductor encapsulating material, area bump package encapsulating material, bump bonding structure encapsulating material, flip chip encapsulating material, lead-free solder encapsulating material, flip chip mounting under-fill material, wafer-level under-fill material, photocoupler encapsulating material and others to construct an electronic part. As products obtained by using a flame-retardant epoxy resin composition of the present invention, there can be exemplified: IC, LSI, VLSI, thyrister, diode, TSOP (Thin Small Outline Package), BGA (Ball Grid Array), CSP (Chip Scale/Size Package), COF(Chip On Film/FPC) and others.

As opto-device material, a flame-retardant epoxy resin composition of the present invention can be used as encapsulating material for fabrication of LED, a photodiode, a phototransistor, CCD and others.

(6) Optical Material and Casting Material

A flame-retardant epoxy resin composition of the present invention is used in an optical material of an interlayer insulating film for an element of a liquid crystal display of a segment type, a simple matrix scheme or an active matrix scheme and in encapsulating material for an element of a liquid crystal display, thus constructing an electronic part. Furthermore, a flame-retardant epoxy resin composition of the present invention can be used as a casting material in a coil insulating material for a relay, a motor, a transformer, an antenna and others.

Electronic parts described above are subjected to any suitable electrical treatment and machining to follow and further used in the following applications, which are, for example, a printer, a computer, a word processor, a key board, a compact information terminal equipment (PDA), a telephone, a portable telephone, a facsimile, a copier, an electronic cash register (ECR), a hand held calculator, an electronic notepad, an electronic dictionary, a card, a holder, an administrative and OA equipment including stationary, a washer, a refrigerator, a cleaner, a microwave oven, a lighting fixture, a game machine, an iron, home electrical appliance such as electric foot warmer, a television set, VTR, a video camera, a radio cassette player, a tape recorder, a mini-disk player, a CD player, a DVD player, a speaker, AV equipment such as a liquid crystal display, an EL display, a plasma display and others, a connector, a relay, a capacitor, a switch, a coil bobbin, a battery, a CCD sensor, an electric wire, a cable, electrical and electronic parts such as a transformer, a motor, an antenna coil, a deflection york, a distribution board, a clock-and others, and communication equipment such as non-contact data carrier package system, and others.

In addition, as other applications of compositions of the present invention, the compositions are processed into molded articles and incorporated into various types of construction materials such as an adhesive agent and a paint, and there are exemplified the following items, which are: materials for an automobile, a vehicle, a ship, an air plane and building such as various types of packing in and a top cloth of a chair or a seat; a belt, ceiling and wall boards, a convertible top, an arm rest, a door trim board, a rear package tray, a carpet, a mat, a sun visor, a wheel cover, a mattress cover, an air bag, an insulating material, a hand grasp, a hand strap, wire covering material, electrically insulating material, paint, coating material, facing material, flooring, a corner wall, a carpet, wall paper, wall facing material, outer facing material, inner facing material, roofing, a sound insulating board, heat insulating board, window shade or curtain; and equipment and supplies for daily life and sports such as clothes, curtain, bed sheets, plywood, a synthetic fiber plate, carpet, a main entrance mat, a sheet, a bucket, a hose, a container, eyeglasses, a bag, a case, goggles, a ski, a snowboard, a skateboard, a racket, a tent and a musical instrument.

EXAMPLES

Then, there will be shown synthetic examples, examples and comparative examples and therewith, detailed description will be given of the present invention. Evaluation of various aspects of performance was valued as measured according to the following schemes.

1. Thermal Deformation Temperature

The temperature was measured in conformity with ASTM D-648 with a load of 1.82 Mpa, which is used as an index for heat resistance.

2. Flame Retardance

A test piece of a size of 1/16 inch in thickness, 5 inch in length and 0.5 inch in width was prepared and an evaluation test for flame retardance was applied to the test piece according to UL-94 standard (Test for Flammability of Plastic Materials for Parts in Devices and Appliances UL94, Fourth Edition). Definitions of terms and evaluation criteria used in UL94 are as follows:

[Definitions of Terms]

Afterflame is that flaming (burning with a flame) of a material after contact of a flame (after removing an igniter) is sustained.

An afterflame time is a length of a time during which a material is burning with a flame after contact of a flame under test conditions.

Afterglow is that after flaming is over or after contact of a flame unless flaming occurs, glowing of a material (though not burned with a flame, being kept in a red heat state serving as an igniter) is sustained as is.

An afterglow time is a length of a time during which after contact of a flame and/or after flaming is over, a material is kept in a read heat state serving as an igniter under test conditions.

t1 is an afterflame time after a first flaming operation, t2 is an afterflame time after a second flaming operation and t3 is an afterglow time after the second flaming operation.

[Evaluation Criteria]

94 V-0

(1) afterflame times t1 or t2 of each of test pieces is 10 sec or less, (2) the sum (t1+t2) of afterflame times of 5 test pieces is 50 sec or less, (3) the sum (t2+t3) of an afterflame time and an afterglow time of each of test pieces after the second flaming operation is 30 see or less, (4) afterflame or afterglow of any test piece does not reach a fixation clamp, and (5) a sign of cotton is not ignited by a flaming particle or droppings.

As thermoplastic resin, thermoset resin and fluororesin, the following resins were employed:

Epoxy resin: phenol novolak epoxy resin made by DAINIPPON INK KABUSHIKI KAISHA with a trade name of Epiclon N-770, Epoxy resin: cresol novolak epoxy resin with an epoxy equivalent of 215 g/eq., Phenol resin: a hydroxyl equivalent of 106 g/eq., Aromatic polycarbonate resin made by Mitsubishi Engineering Plastics Corp with a trade name of Jupilon S-2000N ABS resin made by Mitsui Chemical Corp. with a trade name of Santac UT-61, and Polytetrafluoroethylene (PTFE) made by Asahi Glass Co., Ltd. with a trade name of G-307.

Synthetic Example 1

Synthesis of a Raw Material Phosphazene

Into a 10L flask equipped with a reflux condenser, a thermometer, a stirrer, a phosphorous trichloride dropper and a chlorine gas blowing pipe, 5 L of chlorobenzene, 365 g (6.8 mol) of ammonium chloride and 5.0 g of zinc chloride were put to obtain a mixed dispersion liquid. The dispersion liquid was heated to a temperature of 130° C. and 851 g of phosphorous trichloride was dropped thereinto at the temperate under reflux at a feed rate of 8.9 g/min over 96 min and 454 g of chlorine gas was simultaneously fed thereinto at a feed rate of 4.7 g/min over 96 min. After phosphorus trichloride and chlorine gas were fed, the dispersion liquid was refluxed at temperature of 132° C. for another 144 min to complete a reaction. Then, the dispersion liquid was subjected to suction filtration to remove non-reacted ammonium chloride and a filtrate was distilled under a reduced pressure of 1.3 to 2.7 hPa at 30 to 40° C. to remove chlorobenzene as a distillate and to obtain 704 g of a reaction product. A yield of the reaction product was 98.1% relative to the dropped phosphorous trichloride. The reaction product was dissolved into chlorobenzene and recryatallization was performed to obtain 452 g of a mixture of 76% hexachlorocyclotriphosphazene and 24% octachldrocyclotetraphosphazene. A residual chlorobenzene solution left after recrystallization is concentrated to obtain 249 g of cyclic and chain chlorophosphozenes (a mixture in the general formula (1) with n being 3 to 15, where $R^1O$-group and $R^2O$-group are substituted with chlorine atoms). Furthermore, the mixture of hexachlorocyclotriphosphazene and octachlorocyclotetraphosphazene were recrystallized three times with hexane to obtain 312 g of hexachlorocyclotriphosphazene of a purity 99.9%.

Synthesis Example 2

Synthesis of Phosphazene (A) Having Amino Groups at some but not all Sites

Into a 2 L four-necked flask equipped with a reflux condenser, a thermometer, a stirrer and a dropping funnel, 208.7 g (1.5 mol) of 4-nitrophenol, 141.2 g (1.5 mol) of phenol, 303.6 g (3.0 mol) of triethylamine and 1200 mL of tetrahydrofuran (THF) were put to obtain a solution. Then, a solution of 116 g (1 unit mol, $NPCl_2$ is 1 unit) of hexachlorocyclotriphosphazene of a purity 99.9% in 300 mL of THF was dropped into the THF solution of 4-nitrophenol, phenol and triethylamine over 2 hours while cooling the solution properly by stirring so that a reaction temperature is 30° C. or lower. After the dropping, the reaction was successively continued at room temperature for another 12 hours while stirring the solution. Then, the reaction was further performed at a reflux temperature of the solvent for another 6 hours to complete the reaction. After the reaction ended, a solid (cyclotriphosphazene with a nitrophenoxy group and a phenoxy group as substitutes in a mixed manner and triethylamine hydrochloric acid salt) was filtered out and the solid was repeatedly washed with 2% potassium hydroxide aqueous solution at 40° C. and water sufficient times till water used in the last washing became neutral. After vacuum drying, there was obtained 272.0 g of a yellow solid at a yield of 98%. A residual chlorine quantity is 0.01% or less and synthesis of the compound was confirmed by performing $^1H$- and $^{31}P$-NMR analysis. A structure thereof was $[NP(OC_6H_4)_{0.97}(OC_6H_4NO_2)_{1.03}]_3$ as the result of the Into a 1 L four-necked flask, 83.3 g (0.3 unit mol) of a cyclotriphosphazene with a nitrophenoxy group and a phenoxy group as substitutes in a mixed manner obtained according to the above process, 5.0 g of active charcoal, 0.5 g of ferric chloride 6 hydrate salt and 600 mL of THF were put and the solution was heated as a pretreatment under reflux for 10 min. Then, 37.6 g (0.6 mol) of 80% hydrazine hydrate was added to the solution, followed by a reaction at a reflux temperature for 8 hours. After the reaction ended, the charcoal was filtered out and a filtrate was concentrated and dried to obtain 71.8 g of a light yellow solid at a yield of 97%. A change from a nitro group to an amino group was confirmed by performing $^1H$- and $^{31}P$-NMR analysis. A structure thereof was $[NP(OC_6H_4)_{0.97}(OC_6H_4NH_2)_{1.03}]_3$ as the result of the analysis. An amino value (active hydrogen equivalent) of the compound was measured according to a common method and a result was 120 g/eq.

Synthesis Example 3

Synthesis of Phosphazene (B) Having Amino Groups at some but not all Sites

A phosphazene having amino groups at some but not all sites in a yellow solid state was obtained to a weight of 75.2 g (at a total yield of 94%) in a similar process to Synthesis Example 2 except for use of 87.6 g (0.3 unit mol) of cyclic and chain clorophosphazenes produced in Synthesis Example 1 (a mixture in the general formula (1) with n being 3 to 15, where $R^1$O-group and $R^2$O-group are substituted with chlorine atoms) instead of hexachlorocyclotriphosphazene and 299.7 g (1.5 mol) of 4-nitromethylphenol instead of 4-nitophenol. A structure thereof was $[NP(OC_6H_4)_{0.97}(OC_6H_4CH_2\ NH_2)_{1.03}]_3$ as the result of $^1H$- and $^{31}P$-NMR analysis. An amino value (active hydrogen equivalent)of the compound was measured according to a common method and a result was 127 g/eq.

Synthetic Example 4

Synthesis of Phosphazene (C) Having Hydroxy Groups at some but not all Sites Into a 2 L four-necked flask equipped with a reflux condenser, a thermometer, a stirrer and a dropping funnel, 116 g (1 unit mol, $NPCl_2$ is 1 unit) of a mixture of 82% hexaclorocyclotriphosphazen and 18% octaclorocyclotetraphosphazen and 200 mL of THF were put to obtain a solution. Then, a THF solution of 4-methoxyphenol sodium salt prepared separately (126.5 g (1.1 mol) of 4-methoxyphenol, 23 g (1 g-atom) of sodium and 400 mL of tetrahydrofuran) was dropped while stirring into the TFT solution of the mixture of hexachlorocyclotriphosphazene and octaclorocyclotetraphosphazen over 1 hour. Since there were observed a violent heat release, the reaction was performed while properly cooling the solution so that a reaction temperature does not exceed 30° C. After the dropping, the reaction was successively continued at 60° C. for another 6 hours while stirring the solution. A residual chlorine quantity of a partially substituted compound obtained by the reaction was at 17.17% and an estimated structure thereof was $[NPCl_{0.99}(OC_6H_4OCH_3)_{1.01}]_{3,4}$.

Then, a THF solution of sodium salt of p-cresol prepared separately (140.6 g (1.3 mol) of p-cresol, 28.8 g (1.2 mol) of sodium and 400 ml of THF) was dropped into the solution of the partially substituted compound over 1 hour while controlling a reaction temperature so as to be at 30° C. or lower by cooling. Then, the reaction was performed for 5 hours at room temperature and furthermore for another 3 hours at a reflux temperature to complete the reaction. After completion of the reaction, THF as a solvent was removed under a reduced pressure as a distillate, 1 L of toluene was added to the product to again dissolve and furthermore, 500 mL of water was added to wash the product, followed by liquid separation. An organic layer was washed with a 5% sodium hydroxide aqueous solution once and further with a 2% sodium hydroxide aqueous solution once, and thereafter, washed with a (1+9) hydrochloric acid aqueous solution once, washed with 5% sodium hydrogencarbonate aqueous solution once, and washed with water twice to cause a pH value of a water layer to be neutral. Then the organic layer was separated and dehydrated with anhydrous magnesium sulfate, followed by removal of toluene as distillate to obtain 270.8 g (at a yield of 98%) of a product in a light yellow oily state. A residual chlorine quantity is 0.01% or lower.

Into a 2 L four-necked flask, 247.9 g (0.9 unit mol) of a cyclophosphazene with a 4-methoxyphenoxy group and 4-methylphenoxy group as substitutes in a mixed manner obtained according to the above process and 1040.0 g (9.0 mol) of pyridine hydrochloric acid salt were put and a temperature of the mixture is gradually raised, followed by a reaction at a temperature in the range of 205 to 210° C. for 1 hour. After cooling the mixture down to room temperature, 300 mL of water was added thereto to dissolve a reaction product and excessive pyridine hydrochloric acid salt and further a pH value of the mixture was adjusted to 6 to 7 with a 20% sodium hydroxide aqueous solution to prepare a reaction solution. Then, extraction was performed on the reaction solution with 1 L of ethyl acetate 4 times, thereafter the collected extracts were combined and washed with 1 L of water saturated with sodium sulfate four times, an organic layer was separated and the organic layer was dehydrated with anhydrous magnesium sulfate, followed by removal of ethyl acetate under a reduced pressure as distillate. Then, the concentrate was dissolved into 300 ml of methanol and the solution was added into 3 L of water to thereby precipitate a crystal, which process was repeated three times, followed by vacuum drying of the crystal obtained by the precipitation to obtain 200.0 g (a yield of 85%) of a light yellow crystal. A residual chlorine quantity in the product is at 0.01% or lower and a quantity of hydroxyl group (OH in %) was quantified according to acetylation method using acetic anhydride and pyridine described on page 316 in Analytical Chemistry Handbook, organic version (compiled by Society of Japan Analytical Chemistry) to obtain a value of 6.5% (the theoretical value of 6.6%). Synthesis of the compound was confirmed by performing $^{1}H$- and $^{31}P$-NMR analysis. An estimated structure thereof was $[NP(OC_6H_4CH_3)_{0.99}(OC_6H_4OH)_{1.01}]_{3,4}$. A hydroxyl group value of the compound was 259 g/eq.

Synthetic Example 5

Synthesis of Phosphazene (D) Having Hydroxyethyl Groups at some but not all Sites Into a 2 L four-necked flask equipped with a reflux condenser, a thermometer, a stirrer and a dropping funnel, 116 g (1 unit mol, $NPCl_2$ is 1 unit) of a mixture of 82% hexachlorocyclotriphosphazene and 18% octaclorocyclotetraphosphazen and 200 mL of THF were put to obtain a solution. Then, a THF solution of phenol sodium salt prepared separately (103.5 g (1.1 mol) of phenol, 23 g (1 g-atom) of sodium and 400 mL of tetrahydrofuran) was added dropwise while cooling by stirring into the THF solution of the mixture of hexachlorocyclotriphosphazene and octaclorocyclotetraphosphazen over 1 hour. After the dropping, the reaction was successively performed at 60° C. for another 6 hours while stirring the solution. A residual chlorine quantity of a partially substituted compound obtained by the reaction was at 20.16% and an estimated structure thereof was $[NPCl_{0.99}(OC_6H_4)_{1.01}]_{3,4}$.

A THF solution of 4-hydroxyethylphenolate prepared separately (179.6 g (1.3 mol) of 4-hydroxyethylphenol, 28.8 g (1.2 mol) of sodium and 400 ml of THF) was added dropwise into the solution of the partially substituted compound over 1 hour while controlling a reaction temperature so as to be at 30° C. or lower by cooling. Then, the reaction was performed for 5 hours at room temperature and furthermore for another 6 hours at a reflux temperature to complete the reaction. After completion of the reaction, THF as a solvent was distilled off under a reduced pressure, then 1 L of toluene was added to the product to redissolve the product and furthermore 500 mL of water was added to wash the product, followed by liquid separation. An organic layer was washed with a 5% sodium hydroxide aqueous solution once and furthermore with a 2% sodium hydroxide aqueous solution once, and thereafter, washed with a (1+9) hydrochloric acid aqueous solution once, washed with 5% sodium hydrogencarbonate aqueous solution once, and washed with water twice to cause a pH value of the water layer to be neutral. Then the organic layer was separated and dehydrated with anhydrous magnesium sulfate, followed by distillation of toluene to obtain 250.2 g (at a yield of 91%) of a product in a light yellow oily state. A residual chlorine quantity of the product is 0.01% or lower and synthesis of the compound was confirmed by performing $^{1}H$- and $^{31}P$-NMR analysis. A hydroxyl group content was 6.0% (a theoretical value of 6.1%). An estimated structure thereof was $[NP(OC_6H_4CH_2CH_2OH)_{0.99}(OC_6H_4)_{1.01}]_{3,4}$. A hydroxyl group value of the compound was 278 g/eq.

Synthetic Example 6

Synthesis of Phosphazene (E) Having Glycidyl Groups at some but not all Sites

Into a 1 L reactor equipped with a stirrer, a reflux condenser and a thermometer, 78.4 g (0.3 unit mol) of phosphazene (C) having hydroxy groups at some but not all sites obtained in Synthesis Example 4 and 277.6 (3 mol) of epichlorohydrin were put to heat and dissolve. Then, a 40% sodium hydroxide aqueous solution (12 g (0.30 mole) of sodium hydroxide) was added dropwise to the phosphazene solution at a temperature in the range of 95 to 118° C. over 60 min. The reaction was performed at the same temperature for another 15 min to complete the reaction. After completion of the reaction, epichlorohydrin and water were distilled off, 1 L of chloroform and 1 L of water were added to the reaction solution, followed by washing with water twice. An organic layer separated was dehydrated with anhydrous magnesium sulfate, followed by distillation of chloroform to obtain 87.7 g of a light yellow solid at a yield of 92%. Synthesis of the compound was confirmed by performing $^{1}H$- and $^{3}P$-NMR analysis. An estimated structure thereof was $[NP(OC_6H_4CH_3)_{0.99}(OC_6H_4OGly)_{1.01}]_{3,4}$ (where Gly indicates a glycidyl group and this applies hereinafter in the description). An epoxy equivalent of the compound was 315 g/eq.

Synthetic Example 7

Synthesis of Phosphazene (F) Having Glycidyl Groups at some but not all Sites

A phosphazene having glycidyl groups at some but not all sites in a yellow solid state was obtained to a weight of 92.2 g (at a yield of 93%) in a similar process to Synthesis Example 6 except for use of 82.5 g (0.3 unit mol) of a phosphazene (D) having hydroxyethyl groups at some but not all sites obtained in Synthesis Example 5. Synthesis of the compound was confirmed by performing $^{1}H$- and $^{31}P$-NMR analysis. An estimated structure thereof was $[NP(OC_6H_4CH_2CH_2OGly)_{0.99}(OC_6H_4)_{1.01}]_{3,4}$. An epoxy equivalent of the compound was 333 g/eq.

Synthetic Example 8

(Synthesis of Phenoxyphosphazene Compound (K))

Into a 1L four-necked flask equipped with a stirrer, a thermometer and a reflux condenser, 123.0 g (1.3 mol) of phenol was added and further 500 ml of THF was added to form a homogeneous solution. Then, 27.6 g of metallic sodium was put into the solution at a temperature of 25° C. or lower and thereafter, a temperature of the solution was raised to 61° C. over 1 hour after input of metallic sodium, followed by stirring the solution at a temperature from 61 to 68° C. for 6 hours, thereby preparing a sodium phenolate solution.

In parallel to the above reaction, 58.0 g (0.5 unit mol) of a mixture of hexachlorocyclotriphosphazene and octachlorocyclotetraphosphazene (76% a trimer and 24% a tetramer) were dissolved into 250 mL of THF in a 2 L four-necked flask and the sodium phenolate solution prepared as described above was added dropwise into the solution of the mixture in a state being stirred at a temperature of 25° C. or lower. After the dropping ended, a reaction was caused in the mixture solution at a temperature from 71 to 73° C. for 15 hours while stirring. After completion of the reaction, the reaction mixture was concentrated and further redissolved into 500 ml of toluene, thereafter washed with water, washed with a 5% sodium hydroxide aqueous solution three times, washed with a 5% hydrochloric acid aqueous solution, washed with a 5% sodium hydrogencarbonate aqueous solution and washed with water three times, followed by concentration and drying of the reaction mixture to obtain 109 g (at a yield of 94%) of a light yellow solid.

A residual chorine quantity (Hy-Cl) was 0.07% and it was confirmed that the product (K) was the following compound by performing $^1$H- and $^{31}$P-NMR analysis:

$[N{=}P({-}OPh)_2]_{3,4}$.

Synthetic Example 9 (Synthesis of Phosphazene Polymer (G))

Into a 1L reactor equipped with a stirrer, a reflux condenser and a thermometer, 78.3 g (0.3 unit mol) of a phosphazene (A) having amino groups at some but not all sites: $[NP(OC_6H_4)_{0.97}(OC_6H_4NH_2)_{1.03}]_3$ obtained in Synthesis Example 2, 105.5 g (0.31 mol) of bisphenol-A diglycidyl ether, 1.0 g of triethanolamine and 700 mL of THF were put and a reaction was performed in the solution under reflux for 6 hours. After completion of the reaction, the reaction solution was concentrated and dried to obtain 180.1 g of a yellow solid. An IR analysis was performed to confirm the absence of a glycidyl group in the product.

Synthetic Example 10

Synthesis of Phosphazene Polymer (H)

A phosphazene polymer (H) in a yellow solid state was obtained to a weight of 184.2 g in a similar process to Synthesis Example 9 except for use of 82.5 g (0.3 unit mol) of a mixture (D) of a cyclotriphosphazene and a cyclotetraphosphazene having a hydroxyethyl group, $[NP(OC_6H_4CH_2CH_2OH)_{0.99}(OC_6H_4)_{1.01}]_{3,4}$, obtained in Synthesis Example 5. An IR analysis was performed to confirm the absence of a glycidyl group in the product.

Synthetic Example 11

Synthesis of Phosphazene Polymer (I)

Into a 1L reactor equipped with a stirrer, a reflux condenser and a thermometer, 190.7 g (0.6 unit mol) of a mixture (E) of a cyclotriphosphazene and a cyclotetraphosphazene each having a glycidyl group, $[NP(OC_6H_4CH_3)_{0.99}(OC_6H_4OGly)_{1.01}]_{3,4}$, obtained in Synthesis Example 6, 1.0 g of triethanolamine and 700 mL of THF were put and a reaction was caused in the solution under reflux for 6 hours. After completion of the reaction, the reaction solution was concentrated and dried to obtain 181.9 g of a yellow solid. An IR analysis was performed to confirm the absence of a glycidyl group in the product.

Synthetic Example 12

Synthesis of Phosphazene Polymer (J)

Into a 1L reactor equipped with a stirrer, a reflux condenser and a thermometer, 99.1 g (0.3 unit mol) of a mixture (F) of a cyclotriphosphazene and a cyclotetraphosphazene each having a glycidyl group, $[NP(OC_6H_4CH_2CH_2OGly)_{0.99}(OC_6H_4)_{1.01}]_{3,4}$, obtained in Synthesis Example 7, 28.2 g (0.3 mol) of phenol, 1.0 g of triethanolamine and 700 mL of THF were put and a reaction was performed in the solution under reflux for 6 hours. After completion of the reaction ended, the reaction solution was concentrated and dried to obtain 123.5 g of a yellow solid. An IR analysis was performed to confirm the absence of a glycidyl group in the product.

Example 1

N.N'-dimethylformamide was added to 100 parts by weight of phenol novolak epoxy resin, 63 parts by weight of a phosphazene compound (A) prepared in Synthesis Example 2 and 0.2 part by weight of triphenylphosphine to prepare a varnish having a non-volatile matter concentration of 60%. Using the varnish, 100 parts of glass cloth of 0.18 mm in thickness made by NITTO BOSEKI CO. LTD. was impregnated with 85 parts of the varnish as solid matter, and the impregnated glass cloth was dried for 5 min in a drying furnace at 150° C. to fabricate a prepreg of a resin content of 45.9%. Six pieces of prepreg thus fabricated were superimposed on one another, two electrolytic copper foils of 35 μm in thickness were further superimposed on the top and bottom sides thereof, the superimposed intermediate was subjected to hot pressure molding at 190° C. under a pressure of 4 Mpa for 120 min to finally obtain a double-sided copper clad laminate of 1.2 mm in thickness. A flame retardance of the laminate thus obtained was evaluated according to the UL-94V standard. A soldering heat resistance and a peel strength were measured in conformity with JIS C 6481, wherein a soldering heat resistance was evaluated by inspecting whether or not appearance abnormality occurs after moisture absorption of a test piece kept in boiling water for 2 hours and in addition, immersion in a solder bath at 260 ° C. for 120 sec. Compounding recipes and results are shown in Table 1.

Examples 2 to 5 and Comparative Example 1

Double-sided copper clad laminates were fabricated in a method similar to that used in Example 1 except for adoption of the recipes shown in Table 1. From the evaluation results shown in Table 1, it is found that the laminates of compounding recipes shown in respective examples are all excellent in flame retardance and moisture resistance.

TABLE 1

| | example 1 | example 2 | example 3 | example 4 | example 5 | comparative example 1 |
|---|---|---|---|---|---|---|
| phenol novolak resin | 100 | 100 | 100 | 50 | 50 | 100 |
| phosphazene compound A | 63 | | | | | |
| phosphazene compound B | | 67 | | | | |
| phosphazene compound D | | | 146 | | | |
| phosphazene | | | | 50 | | |

TABLE 1-continued

| | example 1 | example 2 | example 3 | example 4 | example 5 | comparative example 1 |
|---|---|---|---|---|---|---|
| compound E | | | | | | |
| phosphazene | | | | | 50 | |
| compound F | | | | | | |
| phosphazene | | | | | | 70 |
| compound K | | | | | | |
| phenol resin | | | | 45 | 44 | |
| triphenylphos-phine | 0.2 | 0.2 | 0.2 | 0.2 | 0.2 | 0.2 |
| phosphorus content (%) | 4.8 | 4.8 | 6.7 | 3.4 | 3.3 | 5.5 |
| nitrogen content (%) | 2.2 | 2.1 | 3 | 1.5 | 1.5 | 2.5 |
| UL-94V | V-0 | V-0 | V-0 | V-0 | V-0 | V-0 |
| soldering heat resistance | not anomalous | not anomalous | not anomalous | not anomalous | not anomalous | peeled |
| peel strength (kN/m) | 1.79 | 1.75 | 1.83 | 1.83 | 1.82 | 1.05 |

Example 6

An epoxy resin composition of the present invention was produced in a procedure in which 12% by weight of a phosphazene compound (D) obtained in Synthesis Example 5, 72% by weight of fused silica powder, 0.5% by weight of ester wax and 0.5% by weight of a silane coupling agent were added to 15% by weight of cresol novolak epoxy resin (with an epoxy equivalent of 215), all the components were mixed at ordinary temperature and furthermore kneaded at a temperature from 90 to 95° C., followed by cooling and obtained hard blocks were pulverized.

The epoxy resin composition is transfer injected into a metal mold heated at 170° C. and hardened therein to fabricate a molded article (an encapsulated article). A water absorption, a glass transition temperature and moisture resistance were measured on the molded article and test methods therefor are as follows:

Water Absorption (wt %): an epoxy resin composition of the present invention was transfer molded to produce a test piece of 50 mm in diameter and 3 mm in thickness, the test piece was stored in a saturated water vapor atmosphere at 127° C. under 2 atm for 24 hours and a water absorption was calculated from a change in weight of the test piece.

Glass Transition Temperature (° C.): a test piece same as the test piece for a water absorption test was post-cured (at 175° C. for 8 hours) and thereafter, the test piece were subjected to measurement of a glass transition temperature with a thermal analyzer.

Moisture Resistance (PCT after immersion in a solder bath): A silicon chip (a test element) having two or more aluminum wires thereon was adhered to a 42 alloy frame by using an epoxy resin composition of the present invention and the chip was processed into a flat package molded article of 5×10×1.5 (mm) in size by transfer molding at 175° C. for 2 min. The intermediate molded article was post cured at 175° C. for 8 hours, followed by a moisture resistance test on the test piece. That is, the flat package molded article was subjected firstly to moisture absorption by storing in an atmosphere at 40° C. and 90% RH for 100 hours in advance, secondly to an immersion treatment in a solder bath at 250° C. for 10 sec, then PCT was performed on the article in a saturated water vapor atmosphere at 127° C. under 2.5 atm and if wire disconnection due to corrosion of aluminum occurs on the article in the PCT, the article was evaluated as defective. A relationship between an elapsed time and a frequency of defective occurrence in PCT was investigated. The number of samples was 20.

Comparative Example 2

Molded articles (encapsulated articles) were fabricated to evaluate properties such as moisture resistance and others in a similar manner to Example 6 except for use of a phosphazene compound (K) obtained in Synthesis Example 8 instead of a phosphazene compound (D). Results are shown in Table 2.

TABLE 2

| | example 6 | comparative example 2 |
|---|---|---|
| water absorption (%) | 0.03 | 0.49 |
| glass transition temperature (° C.) | 169 | 161 |
| moisture resistance after 40 hours elapses | 0/20 | 4/20 |
| after 100 hours elapses | 0/20 | 12/20 |
| after 150 hours elapses | 0/20 | 20/20 |
| after 200 hours elapses | 0/20 | — |

In Example 6 of the present invention, wherein phosphazene compounds having an amino group, a hydroxy group and a glycidyl group were used, a hot-state hardness was increased, water absorption was low, an adhesion strength and high temperature storage characteristics were improved as compared with Comparative Example 2 containing a phenoxyphosphazene compound. In the examples wherein a flame retardant of the present invention was used, molded articles were excellent in not only high temperature storage characteristics but also flame retardance.

Reference Example 1

Fifteen parts of a phosphazene compound (G) of Synthetic Example 9 and 0.5 part of PTFE were added to a resin composed of 70 parts by weight of aromatic polycarbonate resin and 30 parts by weight of ABS resin and the components were mixed in a mixer and thereafter, fused and kneaded using a 25 mm two-roll kneader to obtain a flame-retardant resin composition.

The composition was prepared into a test piece of 1/16 inch in thickness by means of injection molding and the test pieces was subjected to evaluation on flame retardance on the basis of the test method of UL-94, measurement on a thermal deformation temperature in conformity with ASTM D-648 and further juicing and mold deposit (MD) phenomena were observed in molding.

Reference Examples 2 to 4

Phosphazene compounds (H) to (J) of Synthetic Examples 10 to 12 were used instead of a phosphazene compound (G) of Synthetic Example 9 and preparation of test pieces and evaluation thereof were performed in a similar way to Reference Example 1. Results are shown in Table 3.

Reference Comparative Example 1

A phenoxyphosphazene compound (K) of Synthetic Example 8 was used instead of a phosphazene compound (G) of Synthetic Example 9 and preparation of test pieces and evaluation thereof were performed in a similar way to Reference Example 1. Results are shown in Table 3.

Reference Example 5

Twenty five parts of a phosphazene polymer (G) produced in Synthetic Example 9 were added to 100 parts of ABS resin and the components were mixed in a mixer and thereafter, fused and kneaded using a 25 mm two-roll kneader to obtain a flame-retardant resin composition.

The composition was prepared into a test piece of 1/16 inch in thickness by means of injection molding and the test pieces were subjected to evaluation on flame retardance on the basis of the test method of UL-94 and measurement on a thermal deformation temperature in conformity with ASTM D-648 and furthermore, juicing and mold deposit (MD) phenomena were observed in molding. Results are shown in Table 3.

Reference Examples 6 to 8

Phosphazene compounds (H) to (J) of Synthetic Examples 10 to 12 were used instead of a phosphazene compound (G) produced in Synthetic Example 9 and preparation of test pieces and evaluation thereof were performed in a similar way to Reference Example 5. Results are shown in Table 3.

Reference Comparative Example 2

A phenoxyphosphazene compound (K) produced in Synthesis Example 8 was used instead of a phosphazene compound (G) produced in Synthetic Example 9 and preparation of test pieces and evaluation thereof were performed in a similar way to Reference Example 5. Results are shown in Table 3. Note that the term "Comparative Example" in the tables is an abbreviation of the term "Reference Comparative Example."

TABLE 3

| | synthetic resin | flame retardant | PTFE part by weight | UL-94V | thermal deformation temperature (° C.) | juicing in molding | MD |
|---|---|---|---|---|---|---|---|
| reference example 1 | PC/ABS | G | 0.5 | V-0 | 109 | absent | absent |
| reference example 2 | PC/ABS | H | 0.5 | V-0 | 106 | absent | absent |
| reference example 3 | PC/ABS | I | 0.5 | V-0 | 108 | absent | absent |
| reference example 4 | PC/ABS | J | 0.5 | V-0 | 106 | absent | absent |
| reference example 5 | ABS | G | 0.5 | V-0 | 82 | absent | absent |
| reference example 6 | ABS | H | 0.5 | V-0 | 83 | absent | absent |
| reference example 7 | ABS | I | 0.5 | V-0 | 81 | absent | absent |
| reference example 8 | ABS | J | 0.5 | V-0 | 83 | absent | absent |
| Comparative example 1 | PC/ABS | K | 0.5 | V-0 | 98 | present | present |
| comparative example 2 | ABS | K | 0.5 | V-0 | 78 | present | present |

In such way, Reference Examples 1 to 8 using phosphazene compounds of the present invention, thermal deformation temperature was raised, neither of juicing and mold deposit phenomena was recognized as compared with Reference Comparative Examples 1 and 2 containing phenoxyphosphazenes. In all of the examples using flame retardants of the present invention, any of vaporization, disappearance and bleeding out was not observed and in addition they are excellent in flame retardance.

A flame-retardant epoxy resin composition of the present invention was excellent in heat resistance and moisture resistance.

Therefore, a molded article obtained by molding a flame-retardant epoxy resin composition of the present invention has such excellent characteristics and is useful for various types of products.

Furthermore, electronic parts such as printed circuit substrate using a flame-retardant epoxy resin composition of the present invention were excellent in heat resistance and moisture resistance and, consequently, have high usefulness in industrial aspects.

What is claimed is:

1. A flame-retardant epoxy resin composition comprising an epoxy resin (A) and a phosphazene compound (B), wherein said phosphazene compound (B) is included in the range of 0.01 to 70% by weight relative to a total quantity of said epoxy resin (A) and said phosphazene compound (B), and wherein said phosphazene compound (B) is at least one member selected from the group consisting of (1) a cyclic and/or a chain phosphazene compound expressed by a general formula(1):

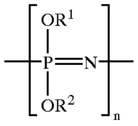

wherein each $R^1$ and $R^2$, being the same or different from each other, is an alkyl group having 1 to 18 carbon atoms, a cycloalkyl group having 5 to 8 carbon atoms, an aryl group having 6 to 14 carbon atoms, an alkylaryl group having 7 to 18 carbon atoms, an alkenyl group having 2 to 18 carbon atoms, an alkenylaryl group having 8 to 18 carbon atoms, an amino group-substituted phenyl group, an aminoalkyl group-substituted phenyl group where the aminoalkyl group has 1 to 6 carbon atoms, a hydroxy group-substituted phenyl group, a hydroxyalkyl group-substituted phenyl group where the hydroxyalkyl group has 1 to 6 carbon atoms, a glycidyloxy group-substituted phenyl group or, a glycidyloxyalkyl group-substituted phenyl group where the glycidyloxyalkyl group has 4 to 9 carbon atoms, providing that at least one of n $R^1$s and n $R^2$s is the amino group-substituted phenyl group, the aminoalkyl group-substituted phenyl group where the aminoalkyl group has 1 to 6 carbon atoms, the hydroxyalkyl group-substituted phenyl group where the hydroxyalkyl group has 1 to 6 carbon atoms, the glycidyloxy group-substituted phenyl group or the glycidyloxyalkyl group-substituted phenyl group where the glycidyloxyalkyl group has 4 to 9 carbon atoms, and n indicates an integer of from 3 to 10000;

(2) a polymer of said cyclic and/or said chain phosphazene compound; and (3) a reaction product of said cyclic and/or said chain phosphazene compound with at least one compound selected from the group consisting of an epoxy compound, a phenol compound, an amine compound and an acid anhydride.

2. The flame-retardant epoxy resin composition according to claim 1, further comprising an epoxy hardener (C), wherein said phosphazene compound (B) and said epoxy hardener (C) are included in the range of 0.01 to 70% by weight and in the range of 0 to 70% by weight, respectively, relative to a total quantity of said epoxy resin (A), said phosphazene compound (B) and said epoxy hardener (C).

3. A flame-retardant epoxy resin composition comprising an epoxy resin (A), a phosphazene compound (B), an epoxy hardener (C) and an inorganic filler (D), wherein said phosphazene compound (B) and said epoxy hardener (C) are included in the range of 0.01 to 70% by weight and in the range of 0 to 70% by weight, respectively, relative to a total quantity of said epoxy resin (A), said phosphazene compound (B) and said epoxy hardener (C), and said inorganic filler (D) is included in the range of 0 to 95% by weight relative to a total quantity of said epoxy resin (A), said phosphazene compound (B), said epoxy hardener (C) and said inorganic filler (D) and wherein said component (B) is at least one member selected from the group consisting of (1) a cyclic and/or a chain phosphazene compound expressed by a general formula (1):

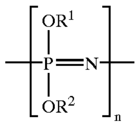

wherein each $R^1$ and $R^2$, being the same as or different from each other, is an alkyl group having 1 to 18 carbon atoms, a cycloalkyl group having 5 to 8 carbon atoms, an aryl group having 6 to 14 carbon atoms, an alkylaryl group having 7 to 18 carbon atoms, an alkenyl group having 2 to 18 carbon atoms, an alkenylaryl group having 8 to 18 carbon atoms, an amino group-substituted phenyl group, an aminoalkyl group-substituted phenyl group where the aminoalkyl group has 1 to 6 carbon atoms, a hydroxy group-substituted phenyl group, a hydroxyalkyl group-substituted phenyl group where the hydroxyalkyl group has 1 to 6 carbon atoms, a glycidyloxy group-substituted phenyl group or a glycidyloxyalkyl group-substituted phenyl group where the glycidyloxyalkyl group has 4 to 9 carbon atoms, providing that at least one of n $R^1$s and n $R^2$s is the amino group-substituted phenyl group, the aminoalkyl group-substituted phenyl group where the aminoalkyl group has 1 to 6 carbon atoms, the hydroxyalkyl group-substituted phenyl group where the hydroxyalkyl group has 1 to 6 carbon atoms, the glycidyloxy group-substituted phenyl group or the glycidyloxyalkyl group-substituted phenyl group where the glycidyloxyalkyl group has 4 to 9 carbon atoms, and n indicates an integer of from 3 to 10000;

(2) a polymer of said cyclic and/or said chain phosphazene compound; and (3) a reaction product of said cyclic and/or said chain phosphazene compound with at least one compound selected from the group consisting of an epoxy compound, a phenol compound, an amine compound and an acid anhydride.

4. A molded article obtained by molding the flame-retardant epoxy resin composition according to claim 1.

5. A molded article obtained by molding the flame-retardant epoxy resin composition according to claim 2.

6. A molded article obtained by molding the flame-retardant epoxy resin composition according to claim 3.

7. An electronic part obtained by molding the flame-retardant epoxy resin composition according to claim 1.

8. An electronic part obtained by molding the flame-retardant epoxy resin composition according to claim 2.

9. An electronic part obtained by molding the flame-retardant epoxy resin composition according to claim 3.

* * * * *